United States Patent
Tanaka et al.

(10) Patent No.: US 9,421,569 B2
(45) Date of Patent: Aug. 23, 2016

(54) PLATING APPARATUS, PLATING METHOD AND STORAGE MEDIUM

(75) Inventors: Takashi Tanaka, Nirasaki (JP); Yusuke Saito, Nirasaki (JP); Mitsuaki Iwashita, Nirasaki (JP); Takayuki Toshima, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 109 days.

(21) Appl. No.: 13/981,124

(22) PCT Filed: Jan. 13, 2012

(86) PCT No.: PCT/JP2012/050597
§ 371 (c)(1),
(2), (4) Date: Jul. 23, 2013

(87) PCT Pub. No.: WO2012/102097
PCT Pub. Date: Aug. 2, 2012

(65) Prior Publication Data
US 2013/0302525 A1    Nov. 14, 2013

(30) Foreign Application Priority Data

Jan. 25, 2011    (JP) ................................. 2011-013444

(51) Int. Cl.
*B05C 5/00* (2006.01)
*B05C 9/14* (2006.01)
*H01L 21/3205* (2006.01)
*B05B 7/16* (2006.01)
*C23C 18/16* (2006.01)
*H01L 21/288* (2006.01)
*B05D 1/02* (2006.01)
*C25D 17/00* (2006.01)
*H01L 21/67* (2006.01)
*G03F 7/16* (2006.01)

(52) U.S. Cl.
CPC . *B05C 5/001* (2013.01); *B05D 1/02* (2013.01); *C23C 18/168* (2013.01); *C23C 18/1614* (2013.01); *C23C 18/1619* (2013.01);

(Continued)

(58) Field of Classification Search
CPC ...................................................... B05C 5/001
See application file for complete search history.

(56) References Cited

U.S. PATENT DOCUMENTS 5,353,369 A * 10/1994 Scarpa et al. ................. 392/441
5,938,845 A *  8/1999 Ang .............................. 118/429

(Continued)

FOREIGN PATENT DOCUMENTS

JP        08-277486 A    10/1996
JP      2000-144438 A     5/2000

(Continued)

OTHER PUBLICATIONS

International Search Report for PCT/JP2012/050597 dated Feb. 14, 2012.

*Primary Examiner* — Binu Thomas
(74) *Attorney, Agent, or Firm* — Pearne & Gordon LLP

(57) ABSTRACT

A plating apparatus includes a substrate holding/rotating device that holds/rotates a substrate; and a plating liquid supplying device that supplies a plating liquid onto the substrate. The plating liquid supplying device includes a supply tank that stores the plating liquid; a discharge nozzle that discharges the plating liquid onto the substrate; and a plating liquid supplying line through which the plating liquid of the supply tank is supplied into the discharge nozzle. Further, a first heating device is provided at either one of the supply tank and the plating liquid supplying line of the plating liquid supplying device, and heats the plating liquid to a first temperature. Furthermore, a second heating device is provided at the plating liquid supplying line between the first heating device and the discharge nozzle, and heats the plating liquid to a second temperature equal to or higher than the first temperature.

6 Claims, 13 Drawing Sheets

(52) U.S. Cl.
CPC .......... *C23C18/1676* (2013.01); *H01L 21/288* (2013.01); *C25D 17/001* (2013.01); *G03F 7/162* (2013.01); *H01L 21/67017* (2013.01)

(56) References Cited

U.S. PATENT DOCUMENTS

| | | | | |
|---|---|---|---|---|
| 6,065,424 | A | * | 5/2000 | Shacham-Diamand et al. .......................... 118/696 |
| 2007/0193510 | A1 | * | 8/2007 | Saijo et al. .................... 118/429 |
| 2008/0196863 | A1 | * | 8/2008 | Takechi ......................... 165/61 |
| 2010/0015791 | A1 | * | 1/2010 | Tanaka et al. ................. 118/302 |
| 2011/0099838 | A1 | * | 5/2011 | Hiroshiro et al. ............... 34/517 |
| 2011/0265718 | A1 | * | 11/2011 | Hara et al. .................... 118/321 |

FOREIGN PATENT DOCUMENTS

| | | | |
|---|---|---|---|
| JP | 2000144438 | A * | 5/2000 |
| JP | 2001-073157 | A | 3/2001 |
| JP | 2007-270224 | A | 10/2007 |
| JP | 2010-024496 | A | 2/2010 |
| JP | 2011-001633 | A | 1/2011 |

* cited by examiner

PLATING APPARATUS, PLATING METHOD AND STORAGE MEDIUM

CROSS-REFERENCE TO RELATED APPLICATION

This Application is a U.S. national phase application under 35 U.S.C. §371 of PCT Application No. PCT/JP2012/050597 filed on Jan. 13, 2012, which claims the benefit of Japanese Patent Application No. 2011-013444 filed on Jan. 25, 2011, the entire disclosures of which are incorporated herein by reference.

TECHNICAL FIELD

The present disclosure relates to a plating apparatus, a plating method and a storage medium for performing a plating process by supplying a plating liquid onto a surface of a substrate.

BACKGROUND ART

Recently, a wiring is formed on a substrate such as a semiconductor wafer or a liquid crystal substrate to form a circuit on a surface of the substrate. The wiring is typically made of, instead of aluminum, copper having low electric resistance and high reliability. Since, however, copper tends to be easily oxidized as compared to aluminum, it is required to plate a surface of the copper wiring with a metal having high electromigration resistance in order to prevent the surface of the copper wiring from being oxidized.

A plating process is performed by supplying an electroless plating liquid onto the surface of the substrate on which the copper wiring is formed. For example, the substrate is held on a substrate holding/rotating device, and by supplying the electroless plating liquid while rotating the substrate holding/rotating device, a uniform flow of the plating liquid is formed on the surface of the substrate. As a result, a plating process is performed on the entire surface of the substrate uniformly (see, for example, Patent Document 1).

Patent Document 1: Japanese Patent Laid-open Publication No. 2001-073157

DISCLOSURE OF THE INVENTION

Problems to be Solved by the Invention

It is known that the plating process using the electroless plating liquid is affected by reaction conditions such as a composition of the plating liquid, a temperature thereof, and so forth. Further, it is also known that the plating liquid heated to a plating temperature generates particles when it makes reaction. For this reason, if the plating liquid is maintained at a temperature higher than the plating temperature for a long time before supplied to the substrate, a quality of the plating liquid may be deteriorated and a lifetime thereof may be shortened.

In view of the foregoing problems, the present disclosure provides a plating apparatus, a plating method and a storage medium capable of solving the above problems.

Means for Solving the Problems

In accordance with one aspect of an illustrative embodiment, there is provided a plating apparatus of performing a plating process by supplying a plating liquid onto a substrate. The plating apparatus includes a substrate accommodating unit configured to accommodate therein the substrate; a plating liquid supplying device configured to supply the plating liquid of a preset temperature to the substrate accommodated in the substrate accommodating unit; and a plating liquid draining device configured to drain the plating liquid dispersed from the substrate out of the substrate accommodating unit. The plating liquid supplying device includes a supply tank configured to store therein the plating liquid to be supplied onto the substrate; a discharge nozzle configured to discharge the plating liquid onto the substrate; and a plating liquid supplying line through which the plating liquid of the supply tank is supplied into the discharge nozzle. Further, a first heating device is provided at either one of the supply tank and the plating liquid supplying line of the plating liquid supplying device, and is configured to heat the plating liquid to a first temperature lower than the preset temperature. Furthermore, a second heating device is provided at the plating liquid supplying line between the first heating device and the discharge nozzle, and is configured to heat the plating liquid to a second temperature equal to or higher than the preset temperature.

The preset temperature of the plating liquid supplied onto the substrate may be equal to or higher than a plating temperature at which self-reaction progresses within the plating liquid.

The first heating device may include a supply tank circulating/heating unit configured to heat the plating liquid within the supply tank to the first temperature, and the supply tank circulating/heating unit may include a supply tank circulating line through which the plating liquid within the supply tank is circulated; and a supply tank heater provided at the supply tank circulating line and configured to heat the plating liquid to the first temperature.

The supply tank circulating line of the supply tank circulating/heating unit may be connected to the plating liquid supplying line in a vicinity of the second heating device.

The first heating device may include a supply line heating unit that is provided at the plating liquid supplying line to be extended up to a vicinity of the second heating device along the plating liquid supplying line, and that is configured to heat the plating liquid to the first temperature.

The second heating device may include a second temperature medium supplying unit configured to heat a heat transfer medium to the second temperature; and a temperature controller provided at the plating liquid supplying line between the first heating device and the discharge nozzle, and configured to heat the plating liquid to the second temperature by using heat of the heat transfer medium from the second temperature medium supplying unit.

The second heating device may further include a first temperature medium supplying unit configured to heat a heat transfer medium to the first temperature, and the second heating device may be configured to supply the heat transfer medium from the first temperature medium supplying unit to the temperature controller after stopping the discharge of the plating liquid from the discharge nozzle.

The first heating device may include a supply line heating unit provided at the plating liquid supplying line to be extended up to a vicinity of the second heating device along the plating liquid supplying line, the supply line heating unit may be formed by a heating pipeline provided to surround the plating liquid supplying line, and the second heating device may be configured to supply the heat transfer medium from the first temperature medium supplying unit into the heating pipeline of the supply line heating unit of the first heating device after stopping the discharge of the plating liquid from the discharge nozzle.

The plating apparatus may further include a physical cleaning device configured to clean the substrate by applying a physical force to the substrate. Further, the physical cleaning device may be configured to clean the substrate by applying the physical force to the substrate after the plating liquid is supplied onto the substrate and before the substrate is dried.

In accordance with another aspect of the illustrative embodiment, there is provided a plating method of performing a plating process by supplying a plating liquid onto a substrate. The plating method includes accommodating the substrate in a substrate accommodating unit; and supplying the plating liquid within a supply tank onto the substrate through a discharge nozzle at a preset temperature. Further, the plating liquid within the supply tank is supplied onto the substrate through the discharge nozzle at the preset temperature after the plating liquid is first heated to a first temperature lower than the preset temperature and then heated to a second temperature equal to or higher than the preset temperature.

The preset temperature of the plating liquid supplied onto the substrate may be equal to or higher than a plating temperature at which self-reaction progresses within the plating liquid.

The plating liquid supplied onto the substrate may be heated to the first temperature within a supply tank circulating line through which the plating liquid within the supply tank is circulated.

The plating liquid within the supply tank may be supplied onto the substrate through the discharge nozzle, after the plating liquid is first heated to the first temperature by a first heating device and then heated to the second temperature by a second heating device disposed between the first heating device and the discharge nozzle.

The plating liquid heated to the second temperature by the second heating device may be cooled to the first temperature after stopping the discharge of the plating liquid from the discharge nozzle.

The plating method may further include cleaning the substrate by applying a physical force to the substrate.

The plating method may further include drying the substrate, and the cleaning of the substrate by applying the physical force to the substrate may be performed after the supplying of the plating liquid onto the substrate and before the drying of the substrate.

In accordance with still another aspect of the illustrative embodiment, there is provided a computer-readable storage medium having stored thereon computer-executable instructions that, in response to execution, cause a plating apparatus to perform a plating method by supplying a plating liquid onto a substrate. Further, the plating method includes accommodating the substrate in a substrate accommodating unit; and supplying the plating liquid within a supply tank onto the substrate through a discharge nozzle at a preset temperature. Furthermore, the plating liquid within the supply tank is supplied onto the substrate through the discharge nozzle at the preset temperature after the plating liquid is first heated to a first temperature lower than the preset temperature and then heated to a second temperature equal to or higher than the preset temperature.

Effect of the Invention

In accordance with the illustrative embodiments, a plating liquid can be heated up to a second temperature through two stages. Accordingly, a lifetime of the plating liquid can be lengthened sufficiently.

BEST MODE FOR CARRYING OUT THE INVENTION

<First Illustrative Embodiment>

Hereinafter, a first illustrative embodiment will be described with reference to FIGS. 1 to 10. First, referring to FIG. 1, an overall plating system 1 in accordance with the first illustrative embodiment will be elaborated.

(Plating System)

Figure 1:
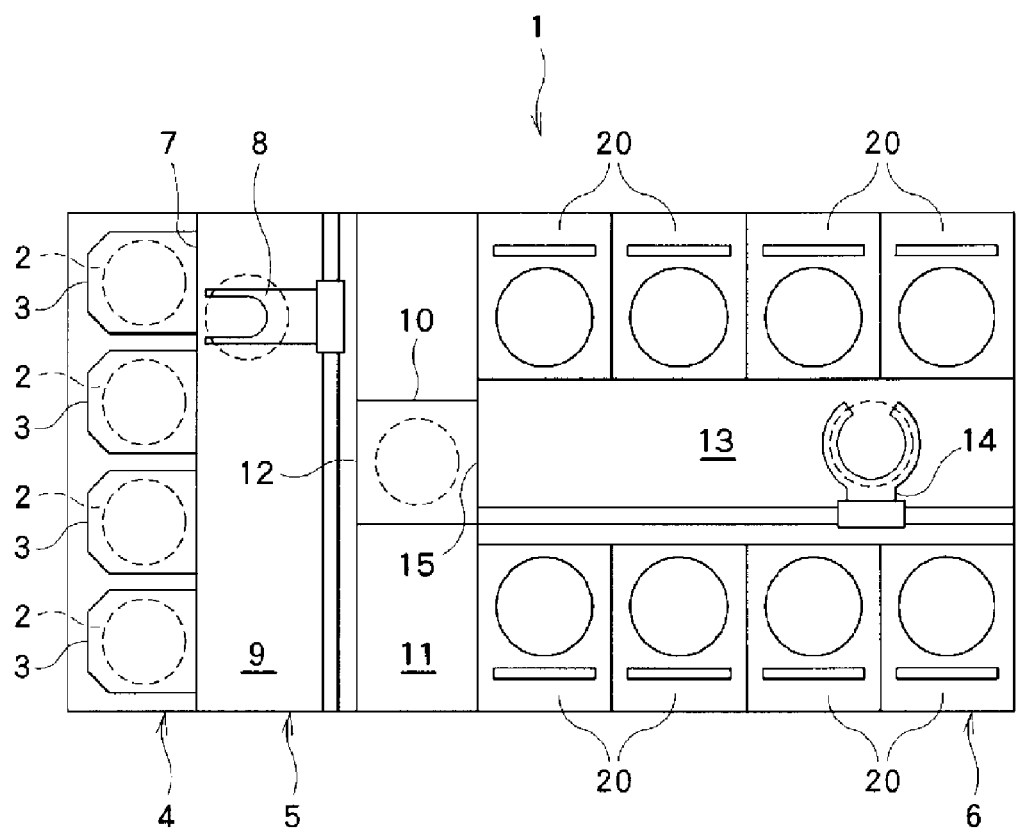
FIG. 1 is a plane view illustrating a schematic configuration of a plating system in accordance with a first illustrative embodiment.

As depicted in FIG. 1, the plating system 1 includes a substrate loading/unloading chamber 5 and a substrate processing chamber 6. The substrate loading/unloading chamber 5 is configured to mount thereon a carrier 3 accommodating a multiple number (e.g., 25 sheets) of substrates 2 (herein, semiconductor wafers), and is configured to load and unload the substrates 2 by a preset number. The substrate processing chamber 6 is configured to perform various processes such as a plating process and a cleaning process on the substrates 2. The substrate loading/unloading chamber 5 and the substrate processing chamber 6 are arranged to be in contact with each other.

(Substrate Loading/Unloading Chamber)

The substrate loading/unloading chamber 5 includes a carrier mounting unit 4; a transfer chamber 9 accommodating therein a transfer device 8; and a substrate transit chamber 11 accommodating therein a substrate transit table 10. Within the substrate loading/unloading chamber 5, the transfer chamber 9 and the substrate transit chamber 11 are connected to and communicate with each other via a transit opening 12. The carrier mounting unit 4 mounts thereon a multiple number of carriers 3, and each of the carriers 3 accommodates therein a multiple number of substrates 2 while holding the substrates 2 horizontally. In the transfer chamber 9, the substrates 2 are transferred, and in the substrate transit chamber 11, the substrates 2 are transited to and from the substrate processing chamber 6.

In this substrate loading/unloading chamber 5, the substrates 2 are transferred by the transfer device 8 between a single carrier 3 mounted on the carrier mounting unit 4 and the substrate transit table 10 by a preset number.

(Substrate Processing Chamber)

The substrate processing chamber 6 includes a substrate transfer unit 13 extended in a forward-backward direction at a central portion thereof; and a multiple number of plating apparatuses 20 arranged side by side in the forward-backward direction at two opposite sides of the substrate transfer unit 13 and configured to perform a plating process by supplying a plating liquid onto the substrates 2.

The substrate transfer unit 13 includes a substrate transfer device 14 configured to be movable in the forward-backward direction. Further, the substrate transfer unit 13 communicates with the substrate transit table 10 of substrate transit chamber 11 via a substrate loading/unloading opening 15.

In this substrate processing chamber 6, the substrates 2 are transferred into each of the plating apparatuses 20 one by one by the substrate transfer device 14 of the substrate transfer unit 13 while held on the substrate transfer device 14 horizontally. Further, in each of the plating apparatuses 20, a cleaning process and a plating process are performed on the substrates 2 one by one.

Except that the respective plating apparatuses 20 use different kinds of plating liquids, the respective plating apparatuses 20 have substantially the same configuration. Thus, hereinafter, a configuration of a single plating apparatus 20 among the multiple number of plating apparatuses 20 will be explained on behalf of the others.

(Plating Apparatus)

Figure 2:
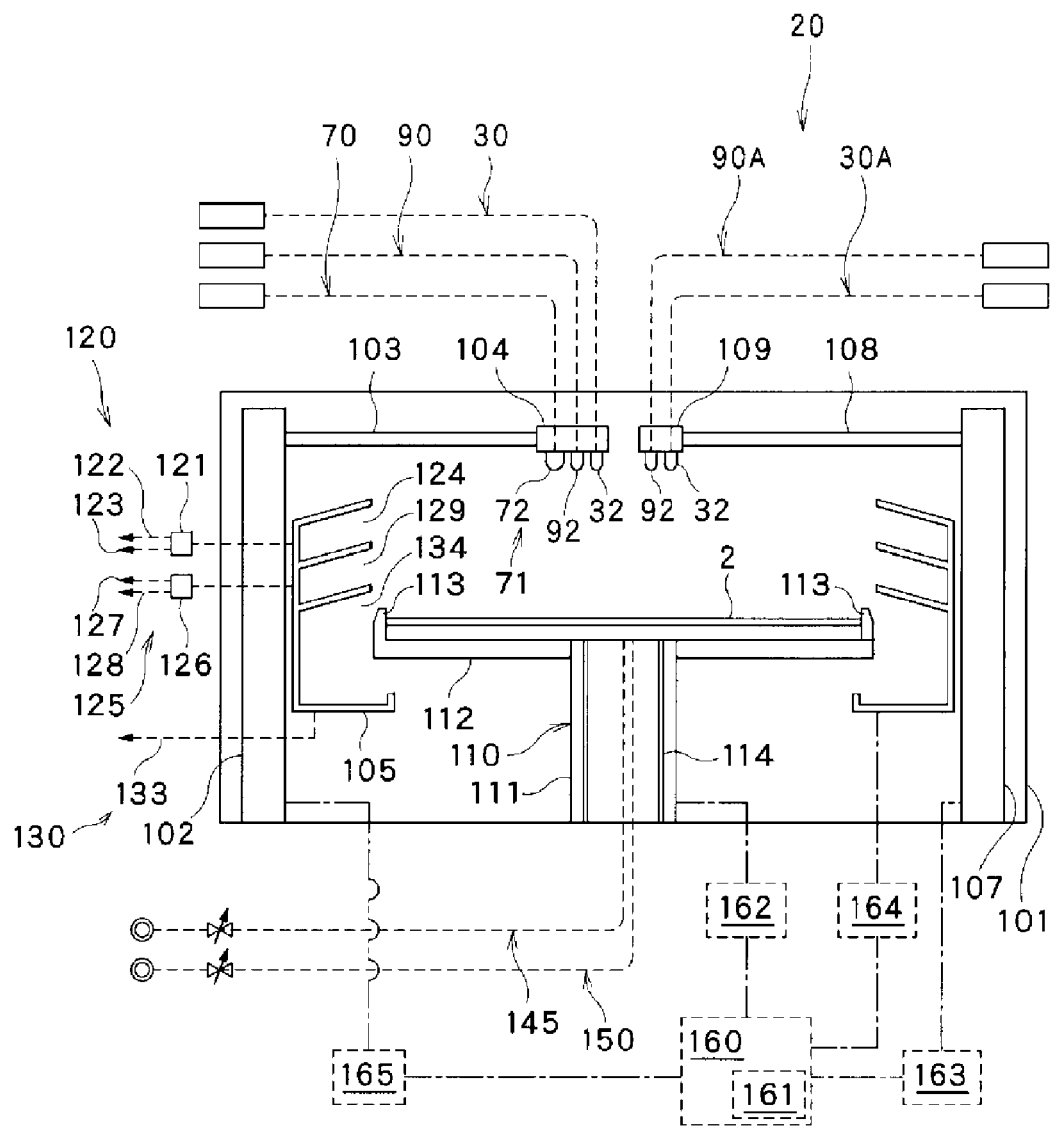
FIG. 2 is a side view illustrating a plating apparatus in accordance with the first illustrative embodiment.
Figure 3:
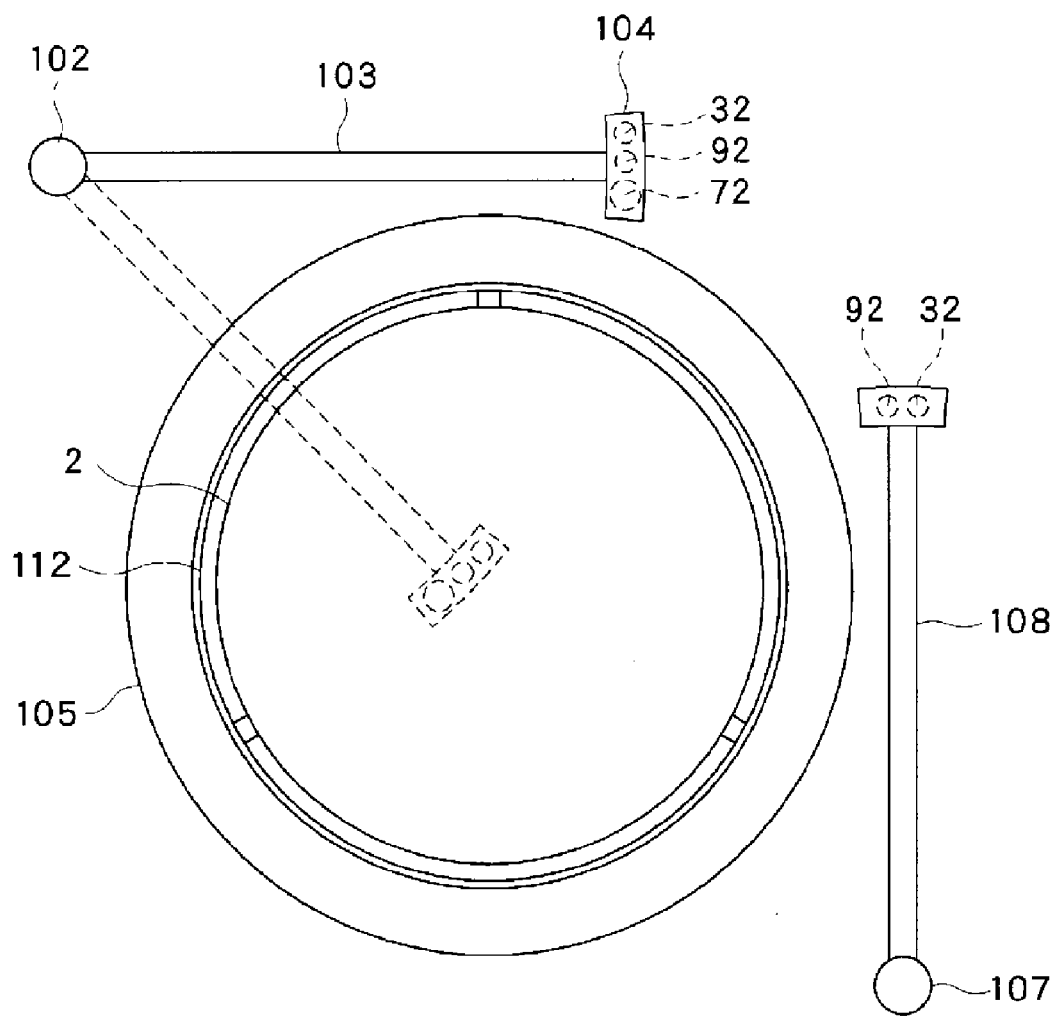
FIG. 3 is a plane view of the plating apparatus shown in FIG. 2.

Below, refereeing to FIGS. 2 and 3, a plating apparatus 20 will be described. FIGS. 2 and 3 are a side view and a plane view illustrating the plating apparatus 20, respectively.

The plating apparatus 20 includes, as illustrated in FIGS. 2 and 3, a substrate holding/rotating device (substrate accommodating unit) 110 configured to hold and rotate a substrate 2 within a casing 101; liquid supplying devices 30, 30A, 90 and 90A configured to supply a plating liquid, a cleaning liquid or the like onto the surface of the substrate 2; liquid draining devices 120, 125 and 130 configured to drain the plating liquid, the cleaning liquid or the like dispersed from the substrate 2; a physical cleaning device 70 configured to clean the surface of the substrate 2 by applying a physical force to the surface of the substrate 2; and a controller 160 configured to control the substrate holding/rotating device 110, the liquid supplying devices 30, 30A, 90 and 90A, the liquid draining devices 120, 125 and 130, and the physical cleaning device 70.

(Substrate Holding/Rotating Device)

The substrate holding/rotating device 110 includes, as illustrated in FIGS. 2 and 3, a hollow cylindrical rotation shaft 111 vertically extended within the casing 101; a turntable 112 provided at an upper end portion of the rotation shaft 111; a wafer chuck 113 disposed on a peripheral portion of a top surface of the turntable 112 to support the substrate 2; and a rotating device 162 configured to rotate the rotation shaft 111. The rotating device 162 is controlled by the controller 160, and the rotation shaft 111 is rotated by the rotating device 162. As a result, the substrate 2 supported on the wafer chuck 113 is rotated.

(Liquid Supplying Device)

Now, the liquid supplying devices 30, 30A, 90 and 90A configured to supply a plating liquid, a cleaning liquid, or the like onto the surface of the substrate 2 will be explained with reference to FIGS. 2 to 5. The liquid supplying device 30 is a plating liquid supplying device configured to supply a Ni-containing plating liquid onto the surface of the substrate 2. The liquid supplying device 90 is a cleaning liquid supplying device configured to supply a cleaning liquid for post-cleaning onto the surface of the substrate 2. The liquid supplying device 30A is a plating liquid supplying device configured to supply a Pd-containing plating liquid onto the surface of the substrate 2. The liquid supplying device 90A is a cleaning liquid supplying device configured to supply a cleaning liquid for pre-cleaning onto the surface of the substrate 2.

(Plating Liquid Supplying Device 30)

Figure 4:
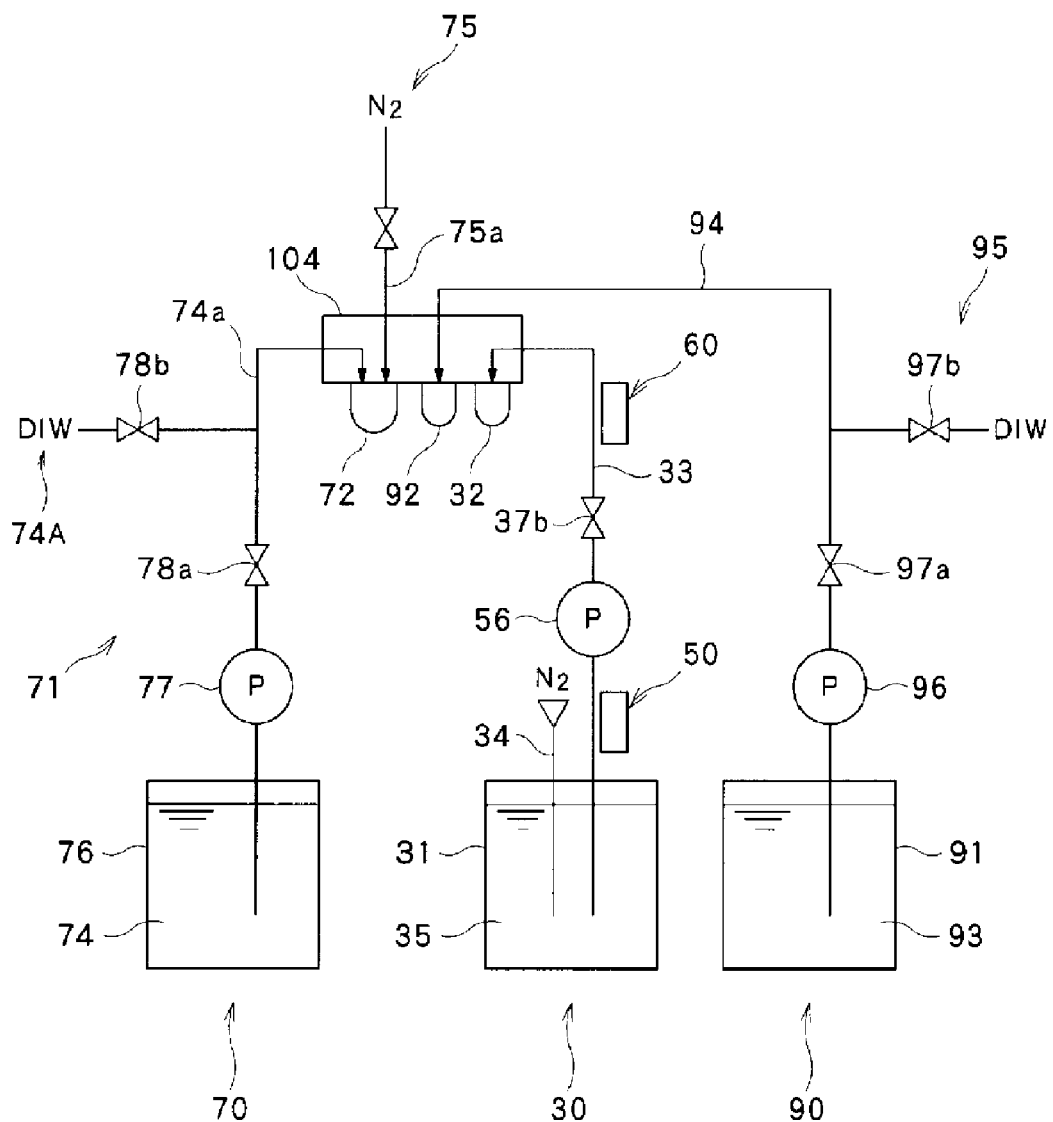
FIG. 4 is a diagram illustrating a plating liquid supplying device in accordance with the first illustrative embodiment.

As shown in FIG. 4, the plating liquid supplying device 30 includes a supply tank 31, a discharge nozzle 32, a plating liquid supplying line 33 and a supply tank deaerating unit 34. The supply tank 31 stores therein a plating liquid 35 to be supplied to the substrate 2 at a preset temperature. The discharge nozzle 32 discharges the plating liquid 35 onto the substrate 2. The plating liquid 35 of the supply tank 31 is supplied to the discharge nozzle 32 through the plating liquid supplying line 33. The supply tank deaerating unit 34 is connected to the supply tank 31 and configured to remove oxygen and hydrogen dissolved in the plating liquid 35 stored in the supply tank 31. Further, as depicted in FIG. 4, a valve 37b that can be opened and closed is provided at the plating liquid supplying line 33.

In the present illustrative embodiment, a 'preset temperature' of the plating liquid supplied onto the substrate 2 is set to be equal to or higher than a plating temperature at which a self-reaction progresses within the plating liquid 35. The plating temperature will be elaborated later.

Various kinds of chemical liquids are supplied into the supply tank 31 from a multiple number of chemical liquid supplying sources (not shown) in which various kinds of components of the plating liquid 35 such as Ni are stored. By way of non-limiting example, the chemical liquids such as NiP metal salt containing Ni ions, a reducing agent and an additive are supplied in the supply tank 31. Here, flow rates of these various kinds of chemical liquids are controlled such that the composition of the plating liquid 35 stored in the supply tank 31 may be appropriately adjusted.

The discharge nozzle 32 is provided at a nozzle head 104. The nozzle head 104 is provided at a leading end portion of an arm 103. The arm 103 is configured to be extendable in a vertical direction and is provided at a supporting shaft 102 rotated by a rotating device 165. With this configuration, the plating liquid can be discharged onto a target position on the surface of the substrate 2 through the discharge nozzle 32 from a required supply height.

In FIG. 2, the plating liquid supplying device 30 is shown to be located at an outer side of the arm 103. However, a position of the plating liquid supplying device 30 may not be particularly limited, and it may be located at an inner side of the arm 103. In the following example, the plating liquid supplying device 30 will be described to be located at an inner side of the arm 103. Likewise, arrangement positions of the plating liquid supplying device 30A, the cleaning liquid supplying device 90, the cleaning liquid supplying device 90A and the physical cleaning device 70 shown in FIG. 2 may not be particularly limited.

Further, as illustrated in FIG. 4, a first heating device 50 configured to heat the plating liquid 35 to a first temperature is provided at either one of the supply tank 31 and the plating liquid supplying line 33 of the plating liquid supplying device 30. Further, a second heating device 60 configured to heat the plating liquid 35 to a second temperature higher than the first temperature is provided at the plating liquid supplying line 33 between the first heating device 50 and the discharge nozzle 32. The supply tank deaerating unit 34, the first heating device 50 and the second heating device 60 will be elaborated later in detail.

(Plating Liquid Supplying Device 30A)

Figure 5:
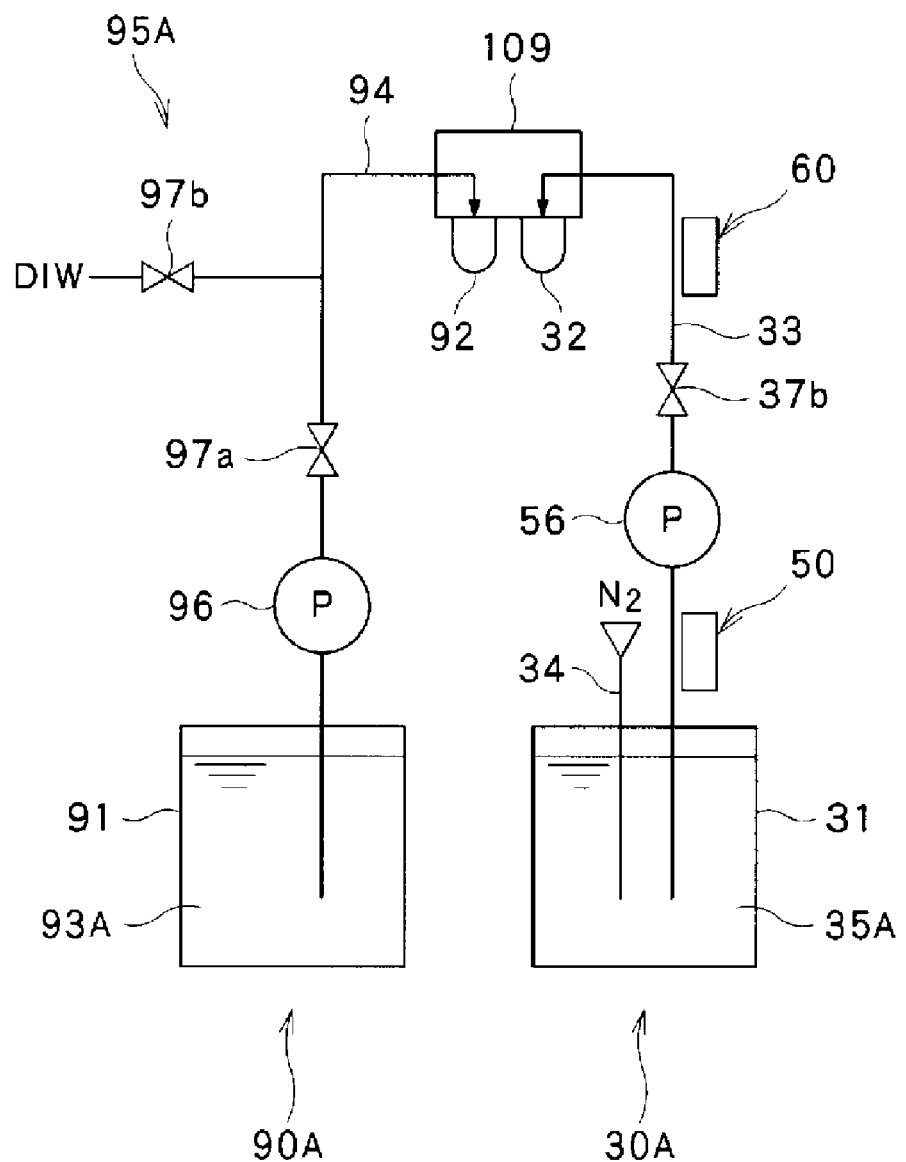
FIG. 5 is a diagram illustrating the plating liquid supplying device in accordance with the first illustrative embodiment.

As illustrated in FIG. 5, except that a different plating liquid 35A is used, the constituent components of the plating liquid supplying device 30A configured to supply a plating liquid to the discharge nozzle 32 are substantially the same as those of the plating liquid supplying device 30. As shown in FIG. 2, the discharge nozzle 32 configured to discharge a Pd-containing plating liquid onto the surface of the substrate 2 is provided at a nozzle head 109. The nozzle head 109 is provided at a leading end portion of an arm 108. The arm 108 is configured to be extendable in a vertical direction and is provided at a supporting shaft 107 rotated by a rotating device 163. With this configuration, the plating liquid can be discharged onto a target position on the surface of the substrate 2 through the discharge nozzle 32 from a required supply height.

In the plating liquid supplying device 30A shown in FIG. 5, the same parts as those of the plating liquid supplying device 30 will be assigned the same reference numerals, and detailed description thereof will be omitted.

(Cleaning Liquid Supplying Device 90)

The cleaning liquid supplying device 90 is used in performing a post-cleaning process on the substrate 2 as will be described later. As shown in FIG. 2, the cleaning liquid supplying device 90 includes a nozzle 92 provided at the nozzle head 104. Further, as illustrated in FIG. 4, the cleaning liquid supplying device 90 further includes a tank 91 configured to store therein a cleaning liquid 93 to be supplied to the substrate 2; a supplying line 94 through which the cleaning liquid 93 of a tank 91 is supplied to the nozzle 92; and a pump 96 and a valve 97a provided at the supplying line 94. Further, as depicted in FIG. 4, the supplying line 94 and the nozzle 92 may be shared between the cleaning liquid supplying device 90 and a rinse liquid supplying device 95 configured to supply a rinse liquid such as pure water onto the surface of the substrate 2. In such a configuration, by controlling the opening and closing of the valve 97a and a valve 97b appropriately, either one of the cleaning liquid 93 and the rinse liquid may be selectively discharged onto the surface of the substrate 2 from the nozzle 92.

(Cleaning Liquid Supplying Device 90A)

The cleaning liquid supplying device 90A is used in performing a pre-cleaning process on the substrate 2 as will be described later. As illustrated in FIG. 2, the cleaning liquid supplying device 90A includes the nozzle 92 provided at the nozzle head 109. As illustrated in FIG. 5, except that a different cleaning liquid 93A is used, the constituent components of the cleaning liquid supplying device 90A are substantially the same as those of the cleaning liquid supplying device 90. In the cleaning liquid supplying device 90A shown in FIG. 5, the same parts as those of the cleaning liquid supplying device 90 will be assigned the same reference numerals, and detailed description thereof will be omitted.

(Liquid Draining Device)

Now, the liquid draining devices 120, 125 and 130 configured to drain the plating liquid or the cleaning liquid dispersed from the substrate 2 will be elaborated with reference to FIG. 2. As shown in FIG. 2, a cup 105 capable of being moved up and down by an elevating device 164 and having discharge openings 124, 129 and 134 is disposed within the casing 101.

The liquid draining devices 120, 125 and 130 are configured to drain the liquids collected in the discharge openings 124, 129 and 134, respectively.

The liquids dispersed from the substrate 2 may be drained by the liquid draining devices 120, 125 and 130 through the discharge openings 124, 129 and 134, respectively, while separated by their kinds. By way of example, the liquid draining device 120 is a plating liquid draining device configured to drain the plating liquid 35; the liquid draining device 125 is a plating liquid draining device configured to drain the plating liquid 35A; and the liquid draining device 130 is a processing liquid draining device 130 configured to drain the cleaning liquids 93 and 93A and the rinse liquid.

As shown in FIG. 2, the plating liquid draining device 120 (125) includes a collecting flow path 122 (127) and a waste flow path 123 (128), which are switched by a flow path switching device 121 (126). Here, the collecting flow paths 122 and 127 are configured to collect and reuse the plating liquids, while the waste flow paths 123 and 128 are configured to dispose of the plating liquids. A plating liquid collecting device configured to reuse the plating liquids collected through the collecting flow paths 122 and 127 will be described later in accordance with a second illustrative embodiment. Further, as shown in FIG. 2, the processing liquid draining device 130 has only a waste flow path 133.

(Physical Cleaning Device)

Now, referring to FIGS. 2 and 4, the physical cleaning device 70 will be explained. The physical cleaning device 70 is configured to clean the surface of the substrate 2 by applying a physical force to the surface of the substrate 2. By way of example, the physical cleaning device 70 may be formed by a droplet discharging unit 71. As will be described later, the droplet discharging unit 71 is controlled by the controller 160 to apply a physical force from droplets to the surface of the substrate 2 before the surface of the substrate 2 is dried and after a plating process or the like is performed thereon.

As illustrated in FIG. 4, the droplet discharging unit 71 forming the physical cleaning device 70 includes two-fluid nozzle 72 configured to discharge droplets of a cleaning liquid 74 onto the surface of the substrate 2; a tank 76 configured to store therein the cleaning liquid 74; a supplying line 74a through which the cleaning liquid 74 of the tank 76 is supplied to the two-fluid nozzle 72; a pump 77 and a valve 78a provided at the supplying line 74a; and a supplying line 75a through which a droplet generating gas 75 such as nitrogen gas is supplied to the two-fluid nozzle 72. The two-fluid nozzle 72 is provided at the nozzle head 104. The nozzle head 104 is configured to be movable by the arm 103 and the rotating device 165 as stated above. Therefore, it is possible to discharge the droplets of the cleaning liquid 74 to a target position on the surface of the substrate 2 through the two-fluid nozzle 72. Further, as illustrated in FIG. 4, the liquid supplied to the two-fluid nozzle 72 through the supplying line 74a may not be the cleaning liquid 74 but may be a rinse liquid 74A such as pure water. In such a configuration, by appropriately controlling the opening and closing operations of the valve 78a and a valve 78b, either one of the cleaning liquid 74 and the rinse liquid may be selectively supplied to the two-fluid nozzle 72.

(Two-Fluid Nozzle)

Figure 6:
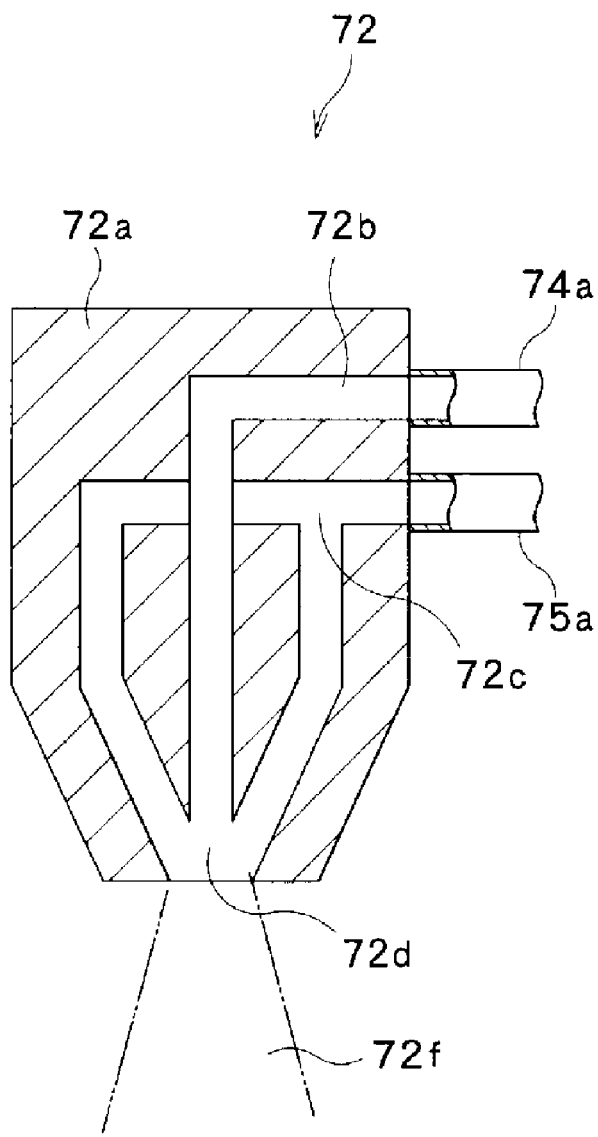
FIG. 6 is a diagram illustrating a two-fluid nozzle of a droplet discharging unit in accordance with the first illustrative embodiment.

Now, referring to FIG. 6, the configuration of the two-fluid nozzle 72 will be described in detail. Here, the term "two-fluid nozzle" refers to a nozzle of a type that generates fine droplets by mixing a gas and a liquid and discharges the generated fine droplets. In FIG. 6, a region indicated by dashed double-dotted line indicates a spray range of droplets 72f of the cleaning liquid 74 sprayed from the two-fluid nozzle 72.

The two-fluid nozzle 72 has a substantially cylindrical nozzle main body 72a. A cleaning liquid flow path 72b and a gas flow path 72c are formed within the nozzle main body 72a. The cleaning liquid flow path 72b communicates with the supplying line 74a through which the cleaning liquid 74 is supplied, and a gas flow path 72c communicates with the supplying line 75a through which a droplet generating gas 75 is supplied. The cleaning liquid 74 and the droplet generating gas 75 collide to be mixed with each other in a mixing portion 72d. As a result, the droplets 72f of the cleaning liquid 74 are generated in the mixing portion 72d and discharged onto the substrate 2.

Now, the supply tank deaerating unit 34, the first heating device 50 and the second heating device 60 provided in the plating liquid supplying device 30 (30A) will be elaborated.

(Supply Tank Deaerating Unit)

Figure 7:
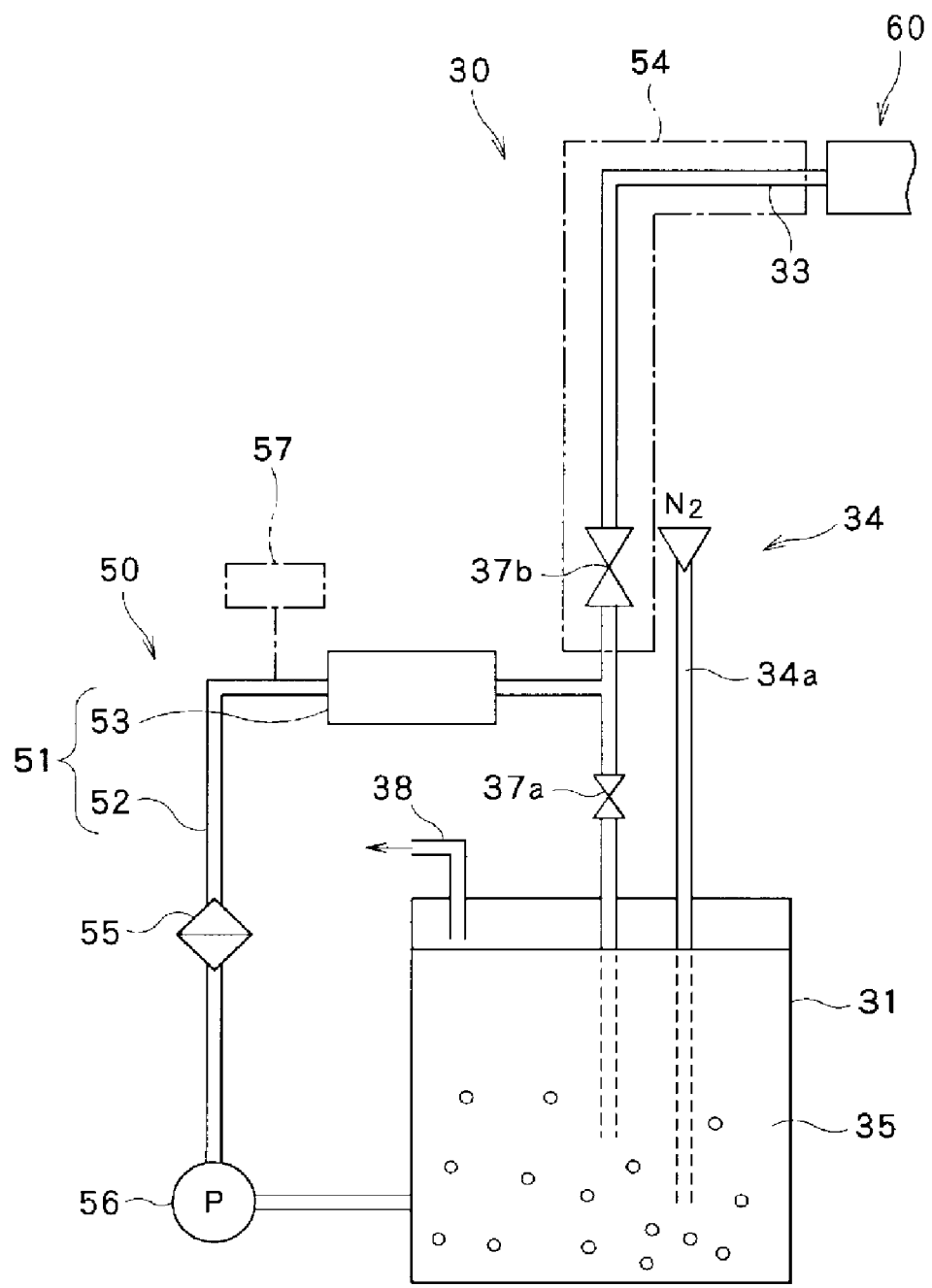
FIG. 7 is a diagram illustrating a first heating device in accordance with the first illustrative embodiment.

The supply tank deaerating unit 34 will be first elaborated. As shown in FIG. 7, the supply tank deaerating unit 34 includes a gas supplying line 34a through which an inert gas such as nitrogen gas is supplied into the supply tank 31.

A part of the inert gas such as nitrogen gas introduced into the plating liquid 35 through the gas supplying line 34a is dissolved in the plating liquid 35. In general, a maximum amount of gas that can be dissolved in the plating liquid 35 depends on a temperature or the like. Accordingly, if the inert gas such as nitrogen gas is additionally dissolved in the plating liquid 35, the other gases already dissolved in the plating liquid 35 such as oxygen gas or hydrogen gas may be exhausted out of the plating liquid 35. In this way, the supply tank deaerating unit 34 having the gas supplying line 34a is configured to remove the dissolved oxygen and the dissolved hydrogen in the plating liquid 35 by bubbling. The oxygen or the hydrogen removed from the plating liquid 35 is exhausted from the supply tank 31 by an exhaust unit 38.

Desirably, the gas supplying line 34a is inserted not up to a vicinity of a top surface of the plating liquid stored in the supply tank 31 but up to a vicinity of a bottom surface of the supply tank 31. Accordingly, the dissolved oxygen and the dissolved hydrogen in the entire region of the plating liquid 35 within the supply tank 31 can be removed. Thus, concentrations of the dissolved oxygen and the dissolved hydrogen in the plating liquid 35 to be supplied to the substrate 2 can be further reduced.

Thought not illustrated, an upper end portion of the supply tank 31 may be hermetically sealed against the exterior environment by a certain sealing member, and an inert gas such as nitrogen gas may be filled between the sealing member and the top surface of the plating liquid. That is, the plating liquid 35 in the supply tank 31 may be placed under an atmosphere of an inert gas such as nitrogen gas. With this configuration, it is possible to prevent the plating liquid 35, in which the dissolved oxygen and the dissolved hydrogen are removed, from being exposed to oxygen and hydrogen.

(First Heating Device)

Now, the first heating device 50 will be described. FIG. 7 illustrates the first heating device 50 including a supply tank circulating/heating unit 51 that is configured to heat the plating liquid 35 to a first temperature. The first temperature is set to be a certain temperature higher than a room temperature and lower than a temperature (plating temperature) at which precipitation of metal ions progresses through self-reaction within the plating liquid 35. By way of example, as for the Ni-containing plating liquid 35, a plating temperature thereof is about 60° C. In such a case, the first temperature is set to be in the range from about 40° C. to about 60° C.

The supply tank circulating/heating unit 51 includes, as illustrated in FIG. 7, a supply tank circulating line 52 configured to circulate the plating liquid 35 in a vicinity of the supply tank 31; and a supply tank heater 53 provided at the supply tank circulating line 52 and configured to heat the plating liquid 35 to a first temperature. Further, as depicted in FIG. 7, a filter 55 and a pump 56 configured to circulate the plating liquid 35 are provided at the supply tank circulating line 52. By providing the supply tank circulating/heating unit 51 having this configuration, it is possible to heat the plating liquid 35 in the supply tank 31 to the first temperature while circulating the plating liquid 35 in the vicinity of the supply tank 31. Further, as shown in FIG. 7, the plating liquid supplying line 33 is connected to the supply tank circulating line 52. In this configuration, when a valve 37a shown in FIG. 7 is opened while the valve 37b is closed, the plating liquid 35 passing through the supply tank heater 53 is returned back into the supply tank 31. Meanwhile, when the valve 37a is closed while the valve 37b is opened, the plating liquid 35 passing through the supply tank heater 53 reaches the second heating device 60 through the plating liquid supplying line 33.

Further, as indicated by a dashed dotted line in FIG. 7, a monitoring unit 57 configured to monitor characteristic of the plating liquid 35 may be provided at the supply tank circulating line 52. The monitoring unit 57 may be formed by, but not limited to, a temperature monitor configured to monitor the temperature of the plating liquid 35, a pH monitor configured to monitor pH of the plating liquid 35, or the like.

(Second Heating Device)

Figure 8:
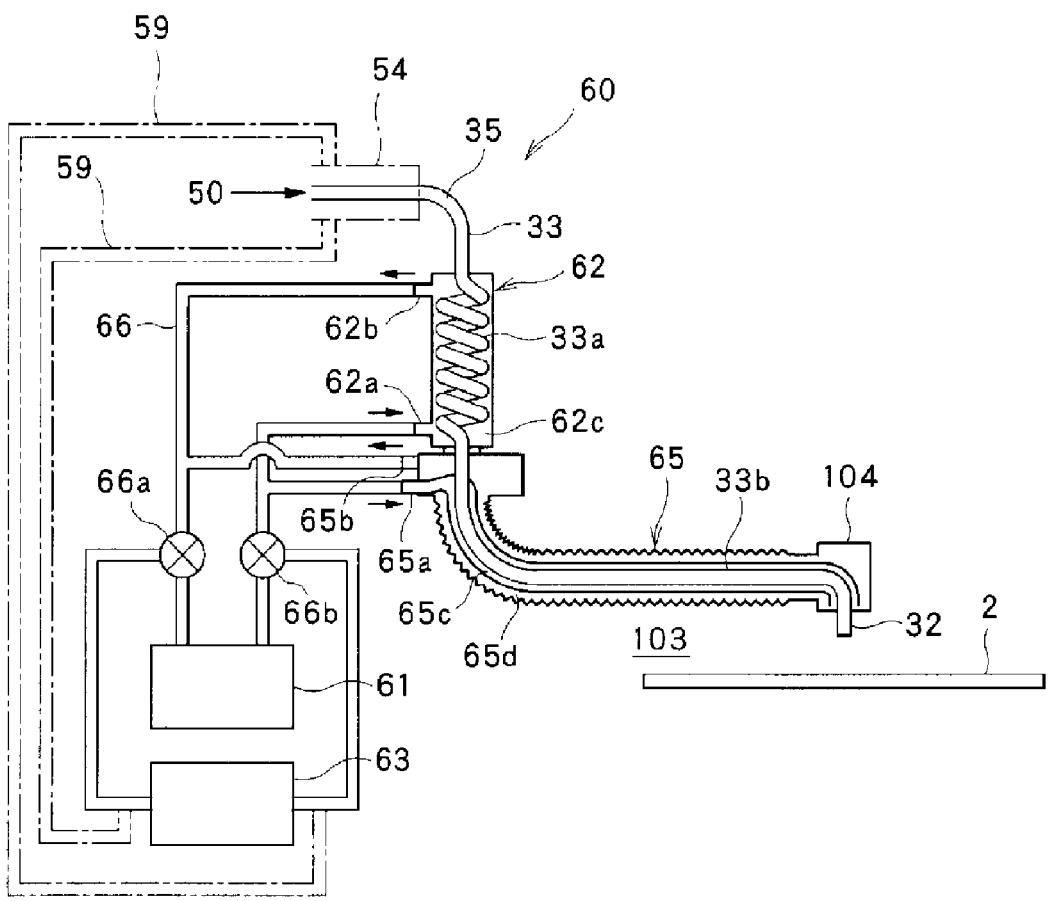
FIG. 8 is a diagram illustrating a second heating device in accordance with the first illustrative embodiment.

Now, referring to FIG. 8, the second heating device 60 will be elaborated. The second heating device 60 is configured to heat the plating liquid 35, which is heated to the first temperature by the first heating device 50, to a second temperature. The second temperature is set to be equal to or higher than the plating temperature as described above. By way of example, the plating temperature of the plating liquid 35 containing Ni is about 60° C. as described above. In this case, the second temperature is set to be in the range from about 60° C. to about 90° C.

As illustrated in FIG. 8, the second heating device includes a second temperature medium supplying unit 61 and a temperature controller 62. The second temperature medium supplying unit 61 is configured to heat a certain heat transfer medium to a second temperature or a temperature higher than the second temperature. The temperature controller 62 is provided at the plating liquid supplying line 33 between the first heating device 50 and the discharge nozzle 32 and is configured to transfer heat of the heat transfer medium from the second temperature medium supplying unit 61 to the plating liquid 35 within the plating liquid supplying line 33. Further, as illustrated in FIG. 8, the second heating device 60 may further include a temperature maintaining unit 65 provided at the arm 103 and configured to maintain the temperature of the plating liquid 35 passing through the plating liquid supplying line 33 located within the arm 103 at the second temperature. Further, in FIG. 8, a part of the plating liquid supplying line 33 located within the temperature controller 62 is indicated by a reference numeral 33a, while a part of the plating liquid supplying line 33 located within the temperature maintaining unit 65 (within the arm 103) is indicated by a reference numeral 33b.

(Temperature Controller 62)

The temperature controller 62 includes a supply opening 62a through which the heat transfer medium (e.g., hot water)

for temperature control is introduced from the second temperature medium supplying unit 61; and a discharge opening 62b through which the heat transfer medium is discharged out. The heat transfer medium supplied through the supply opening 62a comes into contact with the plating liquid supplying line 33a while the heat transfer medium flows in a space 62c within the temperature controller 62. With this configuration, the plating liquid 35 flowing through the plating liquid supplying line 33a is heated to the second temperature. After used for heating the plating liquid 35, the heat transfer medium is discharged out through the discharge opening 62b.

Desirably, the plating liquid supplying line 33a within the temperature controller 62 is formed to have a spiral shape, as shown in FIG. 8. With this configuration, a contact area between the heat transfer medium and the plating liquid supplying line 33a can be increased, so that the heat of the heat transfer medium can be transferred to the plating liquid 35 efficiently.

(Temperature Maintaining Unit 65)

The temperature maintaining unit 65 provided between the temperature controller 62 and the discharge nozzle 32 is configured to maintain, before the plating liquid 35 is discharged from the discharge nozzle 32, the temperature of the plating liquid 35 heated to the second temperature by the temperature controller 62. The temperature maintaining unit 65 includes, as shown in FIG. 8, a heat insulation pipe 65c extended to be in contact with the plating liquid supplying line 33b within the temperature maintaining unit 65; a supply opening 65a through which the heat transfer medium supplied from the second temperature medium supplying unit 61 is introduced into the heat insulation pipe 65c; and a discharge opening 65b trough which the heat transfer medium is discharged. The heat insulation pipe 65c is extended adjacent to the discharge nozzle 32 along the plating liquid supplying line 33b. With this configuration, the temperature of the plating liquid 35 immediately before the plating liquid 35 is discharged from the discharge nozzle 32 can be maintained at the second temperature.

As shown in FIG. 8, the heat insulation pipe 65c may be opened within the nozzle head 104 accommodating therein the discharge nozzle 32, while communicating with a space 65d within the temperature maintaining unit 65. In this configuration, the temperature maintaining unit 65 may have a triple structure (triple-pipe structure) including the plating liquid supplying line 33b located at a central portion of a cross section thereof; the heat insulation pipe 65c surrounding the plating liquid supplying line 33b to be thermally in contact with the plating liquid supplying line 33b; and a space 65d surrounding the heat insulation pipe 65c. The heat transfer medium introduced through the supply opening 65a serves to maintain the temperature of the plating liquid 35 through the heat insulation pipe 65c until the heat transfer medium reaches the nozzle head 104. Then, the heat transfer medium is discharged from the discharge opening 65b after passing through the space 65d within temperature maintaining unit 65. The heat transfer medium flowing in the space 65d serves to thermally isolate the heat transfer medium flowing in the heat insulation pipe 65c (and the plating liquid 35 flowing in the plating liquid supplying line 33b inside the heat insulation pipe 65c) from the atmosphere outside the temperature maintaining unit 65. Accordingly, a heat loss of the heat transfer medium flowing in the heat insulation pipe 65c can be suppressed, and the heat may be transferred from the heat transfer medium flowing in the heat insulation pipe 65c to the plating liquid 35 flowing in the plating liquid supplying line 33b efficiently.

Further, in FIG. 8, the heat transfer medium supplied into the temperature controller 62 and the heat transfer medium supplied into the temperature maintaining unit 65 are both supplied from the second temperature medium supplying unit 61. However, the illustrative embodiment may not be limited to this example, and the heat transfer medium supplied into the temperature controller 62 and the heat transfer medium supplied into the temperature maintaining unit 65 may be supplied from separate heat transfer medium supply sources.

(First Temperature Medium Supplying Unit)

Further, as shown in FIG. 8, the second heating device 60 may further include a first temperature medium supplying unit 63 configured to heat a heat transfer medium to a first temperature and supply the heated heat transfer medium in addition to the second temperature medium supplying unit 61 configured to heat a heat transfer medium to the second temperature and supply the heated transfer medium. In this configuration, while the plating liquid 35 is being discharged from the discharge nozzle 32, the second heating device 60 is controlled by the controller 160 such that the heat transfer medium is supplied from the second temperature medium supplying unit 61 to the temperature controller 62 and the temperature maintaining unit 65. Meanwhile, after stopping the discharge of the plating liquid 35 from the discharge nozzle 32, the second heating device 60 is controlled by the controller 160 such that the heat transfer medium having the first temperature is supplied from the first temperature medium supplying unit 63 to the temperature controller 62 and the temperature maintaining unit 65. With this configuration, after stopping the discharge of the plating liquid 35 from the discharge nozzle 32, the plating liquid 35 remaining in the temperature controller 62 and the temperature maintaining unit 65 can be cooled to and maintained at the first temperature. In this way, by maintaining the remaining plating liquid 35 at the first temperature lower than the plating temperature, heat deterioration of the plating liquid 35 can be prevented, so that a lifetime of the plating liquid 35 can be increased.

In the configuration including the first temperature medium supplying unit 63, as depicted in FIG. 8, flow path switching devices 66a and 66b are provided at the heat transfer medium supplying line 66 which supplies the heat transfer medium to the temperature controller 62 and the temperature maintaining unit 65. The flow path switching devices 66a and 66b are configured to allow either one of the heat transfer medium of the second temperature from the second temperature medium supplying unit 61 and the heat transfer medium of the first temperature from the first temperature medium supplying unit 63 to flow in the heat transfer medium supplying line 66 selectively. Accordingly, it is possible to control the temperature of the plating liquid 35 within the temperature controller 62 and the temperature maintaining unit 65 to the first temperature or the second temperature selectively.

(Other Constituent Components)

As shown in FIG. 2, the plating apparatus 20 may further include a rear surface processing liquid supplying device 145 configured to supply a processing liquid to a rear surface of the substrate 2; and a rear surface gas supplying device 150 configured to supply a gas to the rear surface of the substrate 2.

The plating system 1 including a multiple number of plating apparatuses 20 having the above-described configuration is controlled by the controller 160 according to various kinds of programs recorded in a storage medium 161 provided in the controller 160. Therefore, various processes are performed on the substrate 2. Here, the storage medium 161 stores thereon various kinds of setup data or various kinds of programs such as a plating program to be described later. The storage medium may be implemented by a computer-readable memory such as a ROM or a RAM, or a disk-type storage medium such as a hard disk, a CD-ROM, DVD-ROM or a flexible disk, as commonly known in the art.

In accordance with the present illustrative embodiment, the operations of the plating system 1 and the plating apparatus 20 are controlled to perform a plating process on the substrate 2 according to a plating program recorded on the storage medium 161. In the following description, there will be explained a method of preparing for chemical reduction plating by deaerating and heating a Ni plating liquid used as the chemical reduction plating. Then, there will be also described a method of performing Ni plating by chemical reduction plating after performing Pd plating on the substrate 2 by displacement plating in the single plating apparatus 20, and then, performing Au plating on the substrate 2 by displacement plating in another plating apparatus 20.

(Preparation for Chemical Reduction Plating)

(Deaerating Process)

First, a deaerating process S313 for removing dissolved oxygen and dissolved hydrogen in the plating liquid 35 stored in the supply tank 31 will be elaborated. In this process, as shown in FIG. 7, a nitrogen gas is introduced into the supply tank 31 through the gas supplying line 34a. Accordingly, the dissolved oxygen and the dissolved hydrogen in the plating liquid 35 stored in the supply tank 31 may be displaced with dissolved nitrogen. As a result, the dissolved oxygen and the dissolved hydrogen in the plating liquid 35 can be removed.

(First Temperature Control Process)

Now, a process for controlling the temperature of the plating liquid 35 to be discharged onto the surface of the substrate 2 will be elaborated. First, referring to FIG. 7, there will be explained a first temperature control process S314 in which the plating liquid 35 to be discharged onto the surface of the substrate 2 is heated to the first temperature lower than a certain temperature when the plating liquid 35 is supplied onto the substrate and a plating process is performed on the substrate 2. First, the temperature of the supply tank heater 53 of the first heating device 50 is raised to the first temperature or a certain temperature higher than the first temperature. Then, while circulating the plating liquid 35 within the supply tank circulating line 52 by using the pump 56, the plating liquid 35 is heated to the first temperature. At this time, the valve 37a is opened and the valve 37b is closed. Through this process, the temperature of the plating liquid 35 stored in the supply tank 31 is controlled to the first temperature.

(Second Temperature Control Process)

Now, referring to FIG. 8, there will be described a second temperature control process S315 for heating the plating liquid 35 to a second temperature equal to or higher than the certain temperature when the plating liquid 35 is supplied to the substrate 2 and the plating process is performed. First, the valve 37a is closed and the valve 37b is opened. Accordingly, the plating liquid 35 controlled to the first temperature is supplied into the temperature controller 62 of the second heating device 60 through the plating liquid supplying line 33. In the temperature controller 62, a heat transfer medium heated to a temperature equal to or higher than the second temperature is supplied from the second temperature medium supplying unit 61. Accordingly, the plating liquid 35 is heated to the second temperature while the plating liquid 35 passes through the plating liquid supplying line 33a within the temperature controller 62.

Thereafter, the plating liquid 35 heated to the second temperature is supplied into the discharge nozzle 32 through the arm 103, as illustrated in FIG. 8. Here, the temperature maintaining unit 65 is provided at the arm 103, and a heat transfer medium heated to the second temperature is supplied in the temperature maintaining unit 65 from the second temperature medium supplying unit 61. Accordingly, the plating liquid 35 can be maintained at the second temperature until the plating liquid 35 reaches the discharge nozzle 32 through the plating liquid supplying line 33b within the temperature maintaining unit 65.

Further, the present illustrative embodiment has been described for the example case that the plating liquid 35 is heated to the second temperature while the plating liquid 35 passes through the plating liquid supplying line 33a within the temperature controller 62, but the illustrative embodiment may not be limited thereto. By way of non-limiting example, the plating liquid 35 may be heated to a temperature higher than the first temperature and lower than the second temperature while the plating liquid 35 passes through the plating liquid supplying line 33a within the temperature controller 62, and then, may be heated to the second temperature while the plating liquid 35 passes through the plating liquid supplying line 33b within the temperature maintaining unit 65. In this case, it may be desirable that the plating liquid 35 reaches the second temperature immediately before the plating liquid 35 reaches the discharge nozzle 32. In this way, the time period during which the plating liquid 35 is maintained at the second temperature before discharged from the discharge nozzle 32 can be further shortened.

(First Temperature Maintaining Process)

Desirably, after the Ni plating process on the surface of the substrate 2 is completed, the plating liquid 35 remaining in the temperature controller 62 and the temperature maintaining unit 65 may be cooled to and maintained at the first temperature (first temperature maintaining process S317). In this case, the second heating device 60 is controlled by the controller 160 such that the heat transfer medium of the first temperature is supplied from the first temperature medium supplying unit 63 to the temperature controller 62 and the temperature maintaining unit 65.

(Plating Method)

Now, a method of performing Pd plating on the substrate 2 by displacement plating and then performing Ni plating as prepared as described above by chemical reduction plating in a single plating apparatus 20 will be discussed with reference to FIG. 9.

(Substrate Loading Process and Substrate Receiving Process)

First, a substrate loading process and a substrate receiving process are performed. A single sheet of substrate 2 is loaded into the one plating apparatus 20 from the substrate transit chamber 11 by the substrate transfer device 14 of the substrate transfer unit 13. In the plating apparatus 20, the cup 105 is lowered to a preset position, and the loaded substrate 2 is held by the wafer chuck 113. Then, the cup 105 is raised by the elevating device 164 up to a position where an outer peripheral end portion of the substrate 2 faces the discharge opening 134.

(Cleaning process) Thereafter, a cleaning process S302 including a rinse process, a pre-cleaning process and another rinse process is performed. First, the valve 97b of the rinse liquid supplying device 95A is opened, and then, the rinse liquid is supplied onto the surface of the substrate 2 via the nozzle 92. Then, a pre-cleaning process is performed. First, the valve 97a of the cleaning liquid supplying device 90A is opened, and then, the cleaning liquid 93A is supplied onto the surface of the substrate 2 via the nozzle 92. Thereafter, the rinse liquid is also supplied onto the surface of the substrate 2 via the nozzle 92 in the same manner as described above. The used rinse liquid and the used cleaning liquid 93A are disposed of through the discharge opening 134 of the cup 105 and the waste flow path 133 of the processing liquid draining device 130. Upon the completion of the pre-cleaning process on the surface of the substrate 2, the valve 97a is closed.

(Pd Plating Process)

Subsequently, a Pd plating process S303 is performed. This Pd plating process is performed as a displacement plating process while the substrate 2 is not yet dried after the pre-cleaning process is completed. By performing the displacement plating process while the substrate 2 is not yet dried, it may be possible to prevent copper or the like on a plating target surface of the substrate 2 from being oxidized and failing to perform the displacement plate process effectively.

In the Pd plating process, the cup 105 is raised up to a position where the discharge opening 129 and the outer peripheral end portion of the substrate 2 faces each other by the elevating device 164. Then, the valve 37b of the plating liquid supplying device 30A is opened, and then, the plating liquid 35A containing Pd is discharged onto the surface of the substrate 2 through the discharge nozzle 32 at a desired flow rate. As a result, Pd plating is performed on the surface of the substrate 2 by displacement plating. The used plating liquid 35A is drained out through the discharge opening 129 of the cup 105. Thereafter, the used plating liquid 35A is collected through the collecting flow path 127 or disposed of through the waste flow path 128. Upon the completion of the Pd plating on the surface of the substrate 2, the valve 37b is closed.

(Rinse Process)

Thereafter, a rinse process S304 is performed. Since the rinse process S304 is substantially the same as the rinse process in the cleaning process S302 as described above, detailed description thereof will be omitted.

(Ni Plating Process)

Then, a Ni plating process S305 is performed in the same plating apparatus 20 as used in performing the above-described processes S302 to S304. This Ni plating process is performed as a chemical reduction plating process.

Figure 10:
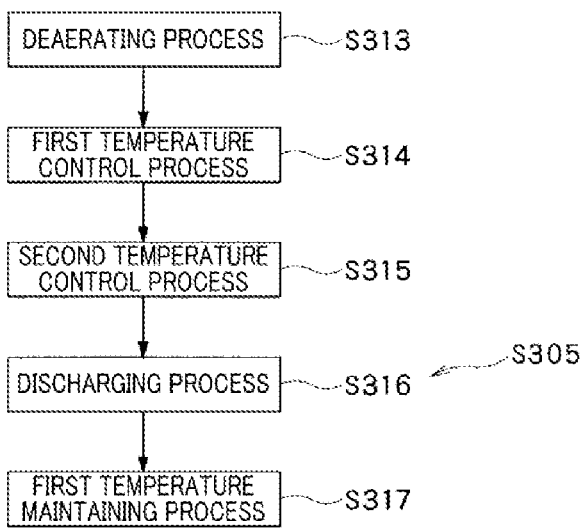
FIG. 10 is a flowchart for describing a Ni plating process of FIG. 9 in detail.

In the Ni plating process S305, as shown in FIG. 10, dissolved oxygen and hydrogen are removed by the supply tank deaerating unit 34, and the plating liquid 35 heated to the second temperature by the second heating device 60 is discharged from the discharge nozzle 32 at a desired flow rate (discharging process S316). As a result, Ni plating is performed on the surface of the substrate 2 by chemical reduction plating. At this time, since the cup 105 is raised up to a position where the discharge opening 124 and the outer peripheral end portion of the substrate 2 faces each other by the elevating device 164, the used plating liquid 35 is discharged through the discharge opening 124 of the cup 105. Then, the used plating liquid 35 is collected into a collecting tank through the collecting flow path 122 or disposed of through the waste flow path 123.

Subsequently, a cleaning process S310 including a rinse process S306, a post-cleaning process S307 and a rinse process S308 is performed.

(Rinse Process)

First, the rinse process S306 is performed on the surface of the substrate 2 on which the Ni plating process has been performed. The valve 97b of the rinse liquid supplying device 95 is opened, and a rinse liquid is supplied onto the surface of the substrate 2 through the nozzle 92.

(Post-Cleaning Process)

Subsequently, the post-cleaning process S307 is performed. First, the valve 97a of the cleaning liquid supplying device 90 is opened, and the cleaning liquid 93 is supplied onto the surface of the substrate 2 through the nozzle 92. The used rinse liquid or the used cleaning liquid 93 is disposed of through the discharge opening 134 of the cup 105 and the waste flow path 133 of the processing liquid draining device 130. Upon the completion of the post-cleaning process on the surface of the substrate 2, the valve 97a is closed.

(Rinse Process)

Then, the rinse process S308 is performed. Since this rinse process S308 is substantially the same as the rinse process S306 as described above, detailed description thereof will be omitted here.

(Drying Process)

Subsequently, a drying process S309 for drying the substrate 2 is performed. By way of example, by rotating the turntable 112, the liquid adhering to the substrate 2 may be dispersed outward by a centrifugal force, so that the substrate 2 may be dried. That is, the turntable 112 may serve as a drying device configured to dry the surface of the substrate 2.

As discussed above, in the single plating apparatus 20, the Pd plating is first performed on the surface of the substrate 2 by displacement plating, and the Ni plating is then performed by chemical reduction plating.

Thereafter, the substrate 2 is transferred into another plating apparatus 20 for Au plating. In this another plating apparatus 20, an Au plating process is performed on the surface of the substrate 2 by displacement plating. Except that a plating liquid and a cleaning liquid different from those of the Pd plating process are used, the method of the Au plating is substantially the same as that of the Pd plating process as described above. Thus, detailed description thereof will be omitted here.

(Effect of First Illustrative Embodiment)

In accordance with the first illustrative embodiment, as stated above, at the supply tank 31 storing the plating liquid 35 to be supplied into the discharge nozzle 32, there is provided the supply tank deaerating unit 34 configured to remove the dissolved oxygen and the dissolved hydrogen in the plating liquid 35 in which various chemical liquids of the plating liquid are adjusted. Thus, the concentration of the dissolved oxygen in the plating liquid 35 can be decreased, so that the lifetime of the plating liquid 35 can be increased. Further, the concentration of the dissolved hydrogen in the plating liquid 35 can also be decreased, so that reduction of metal ions in the plating liquid due to a reduction reaction of the hydrogen can be prevented. Therefore, it is possible to prevent reduced metal ions from being precipitated in a vicinity of the copper wiring. Accordingly, stability of the process can be improved.

Further, in accordance with the first illustrative embodiment, as described above, there are provided the first heating device 50 configured to heat the plating liquid 35 to the first temperature and the second heating device 60 configured to heat the plating liquid 35 to the second temperature. That is, the plating liquid 35 is heated up to the second temperature through two stages. The effect of providing these heating devices will be described in comparison with comparative examples.

In a first comparative example, the plating liquid is heated to the second temperature within the supply tank. In this case, the plating liquid heated to the second temperature is maintained in the supply tank for a long time. In general, if a time period during which the plating liquid 35 is maintained at the second temperature higher than the plating temperature is increased, metal ions in the plating liquid 35 may be oxidized. As a result, the lifetime of the plating liquid 35 may be decreased. Further, while the plating liquid is maintained at the second temperature, the metal ions may be precipitated. As a result, particles can be generated.

However, in accordance with the present illustrative embodiment, by heating the plating liquid 35 to the second temperature through the two stages, the time period during which the plating liquid 35 is maintained at the second temperature can be shortened. Therefore, the lifetime of the plating liquid 35 can be increased. Furthermore, particles can be prevented from being generated.

In a second comparative example, the plating liquid is maintained at a room temperature in the supply tank, and then, the plating liquid is heated to the second temperature within the arm or the like before it is discharged from the discharge nozzle. In this case, since the plating liquid is heated from the room temperature to the second temperature within the arm, it may take a long time to heat the plating liquid.

However, in accordance with the present illustrative embodiment, since the plating liquid 35 in the supply tank 31 is previously heated to the first temperature, it is possible to heat the plating liquid 35 to the second temperature promptly with low energy. Accordingly, while metal ions are prevented from being precipitated, a throughput of the process can be improved.

Furthermore, in accordance with the present illustrative embodiment, as described above, the concentration of the dissolved oxygen in the plating liquid 35 is decreased, and the plating liquid 35 in the supply tank 31 is maintained at the first temperature. Accordingly, in accordance with the present illustrative embodiment, by the synergy effect of these combinations, the lifetime of the plating liquid 35 can be improved remarkably.

(Physical Cleaning Process)

However, even if the supply tank deaerating unit 34 is provided as described above, it may be difficult to completely remove the dissolved hydrogen in the plating liquid 35. In such a case, metal ions in the plating liquid 35 may be reduced by a reduction reaction of the hydrogen, and the reduced metal ions may be precipitated in a spherical shape in the vicinity of the copper wiring. In such a case, the present inventors have found out that it may be effective to clean the substrate 2 by using the physical cleaning device 70 configured to apply a physical force to the surface of the substrate 2, as in the present illustrative embodiment. Below, a method of removing a spherical metal (hereinafter, referred to as "defect") precipitated in the vicinity of the copper wiring by using the physical cleaning device 70 will be explained.

The defect tends to be gathered in a vicinity of a plating film. It is assumed that a liquid such as a plating liquid or a cleaning liquid exists between the plating film and the defect during a plating process or immediately after the plating process.

Figure 9:
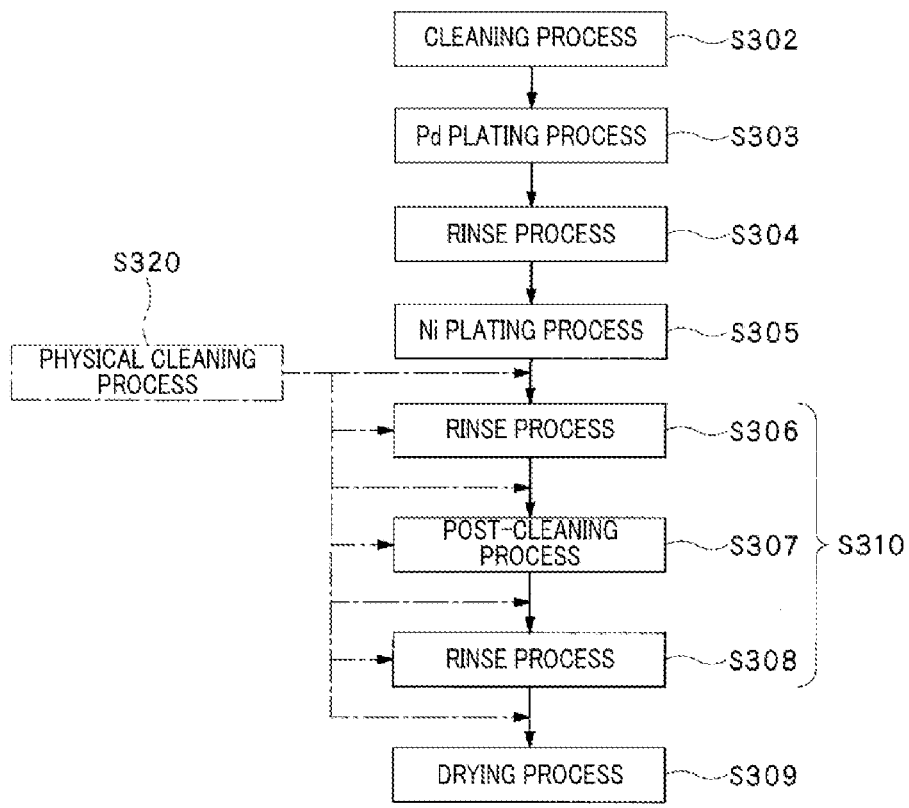
FIG. 9 is a flowchart for describing a plating method.

By way of example, as indicated by a dashed dotted line in FIG. 9, the physical cleaning device 70 is controlled by the controller 160 such that a physical cleaning process S320 is performed after the rinse process S308 is ended and before the drying process S309 is begun. In such a case, the valve 78a is opened, and the cleaning liquid 74 is supplied into the two-fluid nozzle 72 via the supplying line 74a. Concurrently, the droplet generating gas 75 is also supplied into the two-fluid nozzle 72 via the supplying line 75a. Accordingly, droplets of the cleaning liquid 74 are generated and discharged toward the substrate 2. At this time, a rinse liquid may exist between the plating film and the defect.

In accordance with the present illustrative embodiment as described above, there is provided the physical cleaning device 70 configured to apply a physical force to the surface of the substrate 2. Further, the physical cleaning device 70 is controlled by the controller 160 to apply the physical force to the surface of the substrate 2 while the liquid exists between the plating film and the defect before the surface of the substrate 2 is dried. Accordingly, while the liquid exists between the plating film and the defect, it is possible to apply a physical force to the defect, so that the defect can be easily removed from the plating film.

Assume that the substrate 2 is dried with a defect formed thereon. In this case, when the liquid between the plating film and the defect is removed, the defect may adhere to the plating film. If the defect adheres to the plating film, a distance between the plating film and the defect may be shortened, and for this reason, it may become difficult to remove the defect from the plating film. Thus, it may be desirable to operate the physical cleaning device 70 while the liquid such as the rinse liquid, the cleaning liquid or the plating liquid still exists between the plating film and the defect.

(Modification Example of Physical Cleaning Process)

The present illustrative embodiment has been described for the case that the physical cleaning process S320 is performed after the rinse process S308 is ended and before the drying process S309 is begun. However, the illustrative embodiment may not be limited thereto, and the physical cleaning process S320 may be performed at various timings before the substrate 2 is dried.

By way of example, the physical cleaning process S320 may be performed after the Ni plating process S305 is ended and before the rinse process S306 is begun. Further, the physical cleaning process S320 may be performed after the rinse process S306 is ended and before the post-cleaning process S307 is begun. Further, the physical cleaning process S320 may be performed after the post-cleaning process S307 is ended and before the rinse process S308 is begun. In all of these cases, the liquid such as the plating liquid, the rinse liquid or the cleaning liquid exists between the plating film and the defect, so that the defect can be easily removed from the plating film.

It is desirable that the physical cleaning process S320 is performed when the rinse liquid, not the cleaning liquid, exists between the plating film and the defect. In such a case, dispersion of the cleaning liquid due to the physical force may be avoided.

Alternatively, the cleaning process S307 may be performed as the physical cleaning process S320. That is, the cleaning liquid 93 used in the post-cleaning process S307 may be used as the cleaning liquid 74 used in the physical cleaning process S320. In such a case, droplets of the cleaning liquid 93 may be discharged toward the substrate 2 from the two-fluid nozzle 72. As a result, the post-cleaning process is performed on the substrate 2 and, at the same time, the defect may be removed from the plating film.

Still alternatively, the rinse process S308 may be performed as the physical cleaning process S320. That is, the rinse liquid such as pure water used in the rinse process S320 may be used as the cleaning liquid 74 used in the physical cleaning process S320. In such a case, droplets of the rinse liquid are discharged toward the substrate 2 from the two-fluid nozzle 72. As a result, the substrate 2 may be rinsed, and the defect may be removed from the plating film.

(Modification Example of Supply Tank Deaerating Unit)

Further, in the present illustrative embodiment, the supply tank deaerating unit 34 is configured to remove the dissolved oxygen and the dissolved hydrogen in the plating liquid 35 by bubbling. However, the illustrative embodiment may not be limited thereto, and various units configured to remove a dissolved gas in a liquid may be used as the supply tank deaerating unit 34. By way of non-limiting example, there may be used a unit configured to reduce an amount of gas that can be dissolved in the plating liquid 35 by setting the temperature of the plating liquid 35 to be low and configured to remove the dissolved gas in the plating liquid 35.

(Modification Example of Heating Device)

Furthermore, the present illustrative embodiment has been described for the case that the plating liquid 35 is heated to the first temperature in the vicinity of the supply tank 31 by the supply tank circulating/heating unit 51 of the first heating device 50. However, the unit configured to heat the plating liquid 35 to the first temperature in the vicinity of the supply tank 31 may not be limited to the supply tank circulating/heating unit 51, but various other types of units may be used. For example, a heater configured to heat the plating liquid 35 to the first temperature may be provided within the supply tank 31.

Figure 11:
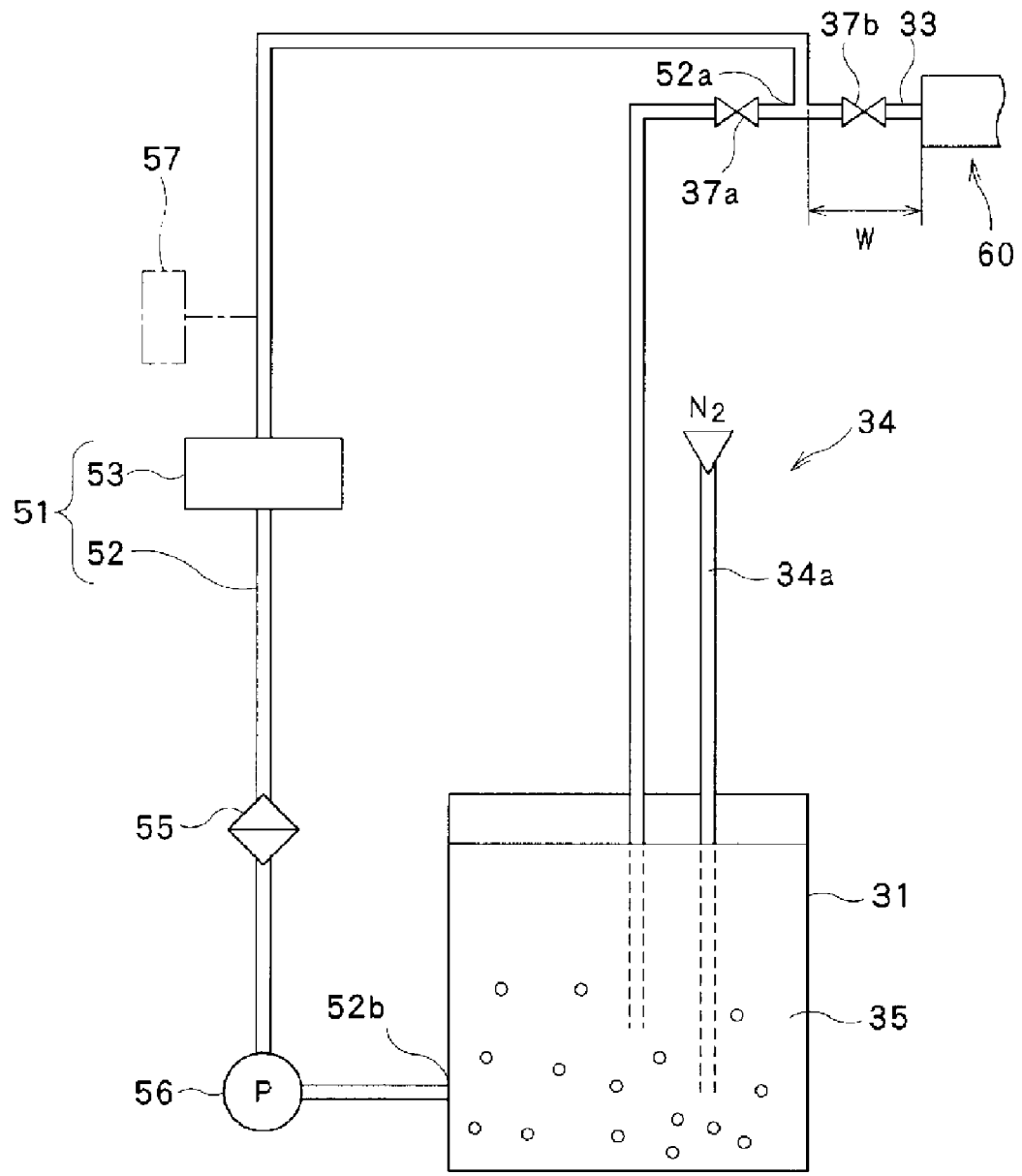
FIG. 11 is a diagram illustrating a modification example of the first heating device.

Moreover, in the present illustrative embodiment, the plating liquid 35 is heated up to the first temperature in the vicinity of the supply tank 31. However, the illustrative embodiment may not be limited thereto, and the plating liquid 35 may be heated to the first temperature only before the plating liquid 35 reaches a vicinity of the second heating device 60. To elaborate, as shown in FIG. 11, the supply tank circulating line 52 of the supply tank circulating/heating unit 51 may be connected to the plating liquid supplying line 33 in the vicinity of the second heating device 60. In this way, by providing the circulation flow path configured to heat the plating liquid 35 to the first temperature at a position closer to the second heating device 60, it is possible to prevent the temperature of the plating liquid 35 from being decreased until the plating liquid 35 reaches the second heating device 60. Accordingly, the plating liquid 35 can be certainly and promptly heated to the second temperature with low energy.

Here, the term "vicinity of the second heating device 60" refers to, for example, a region where a distance w (see FIG. 11) between the supply tank circulating line 52 and the second heating device 60 is set to be equal to or less than about 1 m.

In order to prevent the temperature of the plating liquid 35 from being decreased until the plating liquid 35 reaches the second heating device 60, there may be provided a supply line heating unit 54 configured to maintain the plating liquid 35 passing through the plating liquid supplying line 33 at the first temperature, as depicted by a dashed dotted line in FIG. 7. The supply line heating unit 54 may be formed by a rubber heater provided at the plating liquid supplying line 33 and heated to the first temperature. Alternatively, the supply line heating unit 54 may be formed by a heating pipeline. Here, the heating pipeline may be provided to be in contact with the plating liquid supplying line 33 and a heat transfer medium such as hot water heated to the first temperature may flow through the heating pipeline.

When the heating pipeline through which the heat transfer medium heated to the first temperature flows is used as the supply line heating unit 54, the first temperature medium supplying unit 63 of the second heating device 60 may be used as a medium supplying unit configured to supply the heat transfer medium of the first temperature to the supply line heating unit 54. That is, as indicated by a dashed dotted line in FIG. 8, the heat transfer medium of the first temperature may be supplied from the first temperature medium supplying unit 63 to the supply line heating unit 54 placed adjacent to the second heating device 60 through the supplying line 59. That is, the first temperature medium supplying unit 63 configured to control the temperatures of the temperature controller 62 and the temperature maintaining unit 65 to the first temperature after stopping the discharge of the plating liquid 35 from the discharge nozzle 32 may be used in order to supply the heat transfer medium of the first temperature to the supply line heating unit 54 while discharging the plating liquid 35. With this configuration, it is possible to prevent the temperature of the plating liquid 35 from being decreased until the plating liquid 35 reaches the second heating device 60. Further, the number of the constituent components of the plating apparatus 20 can be reduced.

After stopping the discharge of the plating liquid 35 from the discharge nozzle 32, the heat transfer medium of the first temperature may be supplied to the supply line heating unit 54 from the first temperature medium supplying unit 63 through the supplying line 59. In such a case, it is possible to maintain the plating liquid 35 remaining within the plating liquid supplying line 33 between the supply tank 31 and the second heating device 60 at the first temperature after stopping the discharge of the plating liquid 35 from the discharge nozzle 32. In this case, the plating liquid 35 reaching the second heating device 60 immediately after the discharge of the plating liquid 35 is restarted may be heated to the first temperature. Thus, even immediately after the discharge of the plating liquid is restarted, it may be possible to heat the plating liquid 35 to the second temperature easily and promptly by the second heating device 60. Accordingly, an amount of wasted plating liquid 35 discharged from the discharge nozzle 32 before the temperature of the plating liquid 35 reaches the second temperature can be reduced. As a result, the time period required for restarting the plating process may be shortened, so that a throughput of the process can be improved.

(Modification Example of Physical Cleaning Device)

Figure 12:
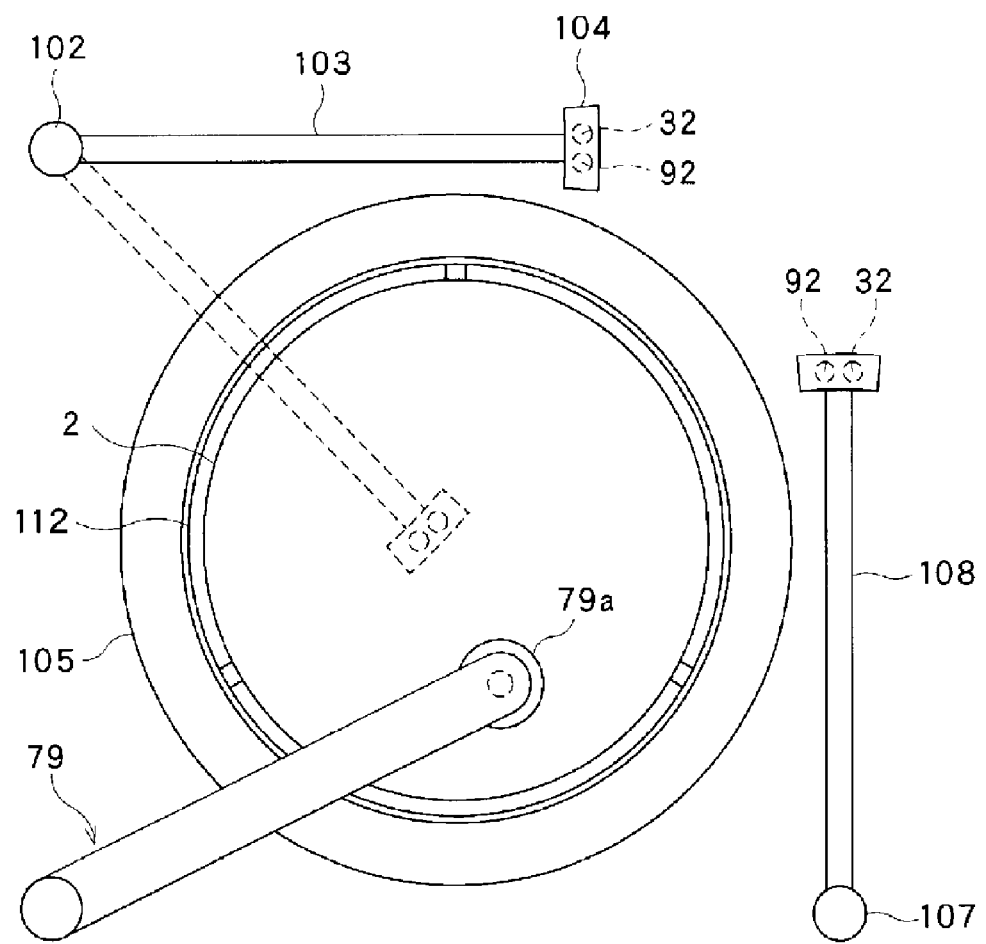
FIG. 12 is a diagram illustrating a modification example of a physical cleaning device.

In accordance with the present illustrative embodiment, the droplet discharging unit 71 configured to discharge droplets of the cleaning liquid 74 is used as the physical cleaning device 70. However, the illustrative embodiment may not be limited thereto, and another unit configured to apply a physical force to the surface of the substrate 2 may be used. By way of example, instead of the droplet discharging unit 71 having the two-fluid nozzle 72, a high-pressure nozzle, an ultrasonic nozzle or a cleaning brush 79 having a brush unit 79a to be brought into contact with the surface of the substrate 2 may be used as the physical cleaning device 70 as illustrated in FIG. 12. In all of these cases, the physical cleaning device 70 may be configured to apply a physical force to a defect while a liquid such as the plating liquid 35 or the like exists between a plating film and the defect, as in the case where the droplet discharging unit 71 is used.

Other Modification Examples

Further, in the present illustrative embodiment, the plating liquid 35 containing Ni is plated on the surface of the substrate 2 by chemical reduction plating in the plating apparatus 20. However, the illustrative embodiment may not be limited thereto, and various other types of plating liquids may be plated on the surface of the substrate 2 by chemical reduction plating in the plating apparatus 20. By way of non-limiting example, a plating liquid containing Co (such as CoWB, CoWP, CoB, CoP, or the like) may be plated on the surface of the substrate 2 by chemical reduction plating. Even in a case that these plating liquids are used, removal of the dissolved oxygen and the dissolved hydrogen by the supply tank deaerating unit 34 may be performed or the two-stage heating of the plating liquid 35 by the first heating device 50 and the second heating device 60 may be performed. In this case, the first temperature and the second temperature may be appropriately determined depending on a plating temperature of the plating liquid. For example, when CoP plating liquid is used as the plating liquid 35, a plating temperature thereof is in the range of about 50° C. to about 70° C., and the first temperature may be set to be in the range of, e.g., about 40° C. to the plating temperature, and the second temperature may be set to be in the range of, e.g., the plating temperature to about 90° C.

Furthermore, in the present illustrative embodiment, the first heating device 50 and the second heating device 60 may also be provided at the plating liquid supplying device 30A, as in the case of the plating liquid supplying device 30. Moreover, the two-stage heating by the first heating device 50 and the second heating device 60 may be performed for the plating liquid 35A containing Pd.

In addition, the above illustrative embodiment has been described for the example case of performing Pd plating on the substrate 2 by displacement plating and then performing Ni plating by chemical reduction plating in the single plating apparatus 20 (see S302 to S309 of FIG. 9). However, the illustrative embodiment may not be limited thereto, and only chemical reduction plating may be performed as a plating process in the single plating apparatus 20. In such a case, among the processes shown in FIG. 9, the processes other than S303 and S304 may be performed. At this time, a plating liquid for the chemical reduction plating may not be particularly limited, and various plating liquids such as CoWB, CoWP, CoB, CoP and NiP for chemical reduction plating may be used.

<Second Illustrative Embodiment>

Figure 13:
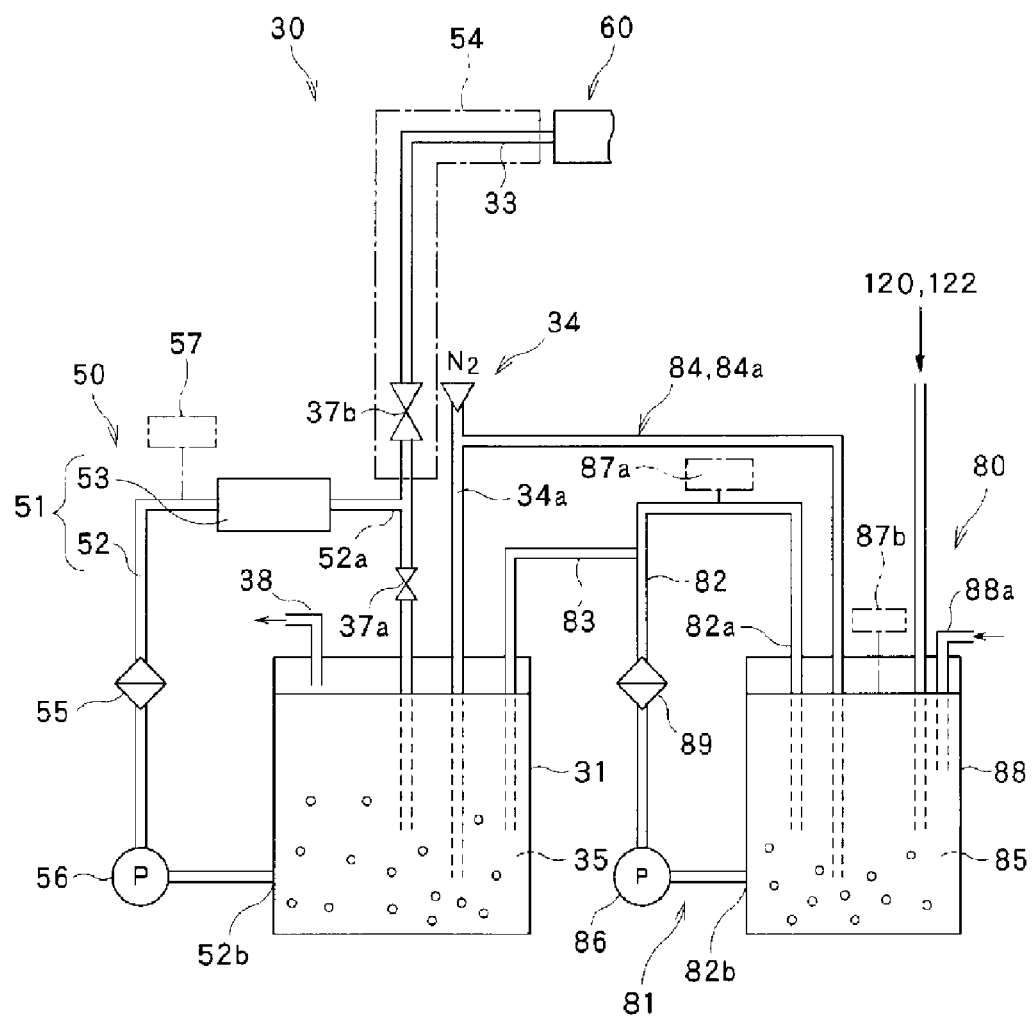
FIG. 13 is a diagram illustrating a plating liquid collecting device in accordance with a second illustrative embodiment.
Figure 14:
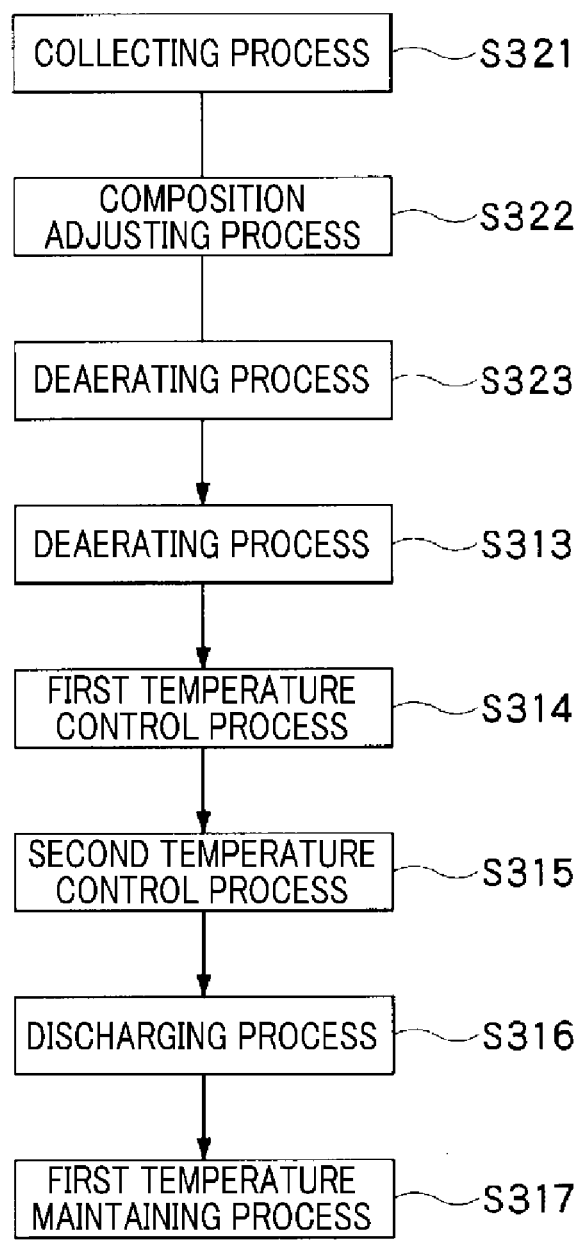
FIG. 14 is a flowchart for describing a Ni plating process in accordance with the second illustrative embodiment in detail.

Now, referring to FIGS. 13 and 14, a second illustrative embodiment will be described. Except that a plating liquid collecting device configured to adjust a composition of a plating liquid drained from a plating liquid draining device and configured to supply the composition-adjusted plating liquid to a supply tank of a plating liquid supplying device is further provided, a configuration of the second illustrative embodiment shown in FIGS. 13 to 14 is substantially the same as that of the first illustrative embodiment shown in FIGS. 1 to 12. In the second illustrative embodiment shown in FIGS. 13 and 14, the same parts as those of the first illustrative embodiment shown in FIGS. 1 to 12 will be assigned same reference numerals, and detailed description thereof will be omitted.

In accordance with the second illustrative embodiment, a used plating liquid containing Ni collected through the collecting flow path 122 of the plating liquid draining device 120 is reused. Below, referring to FIG. 13, a plating liquid collecting device 80 configured to reuse the used plating liquid will be explained.

(Plating Liquid Collecting Device)

As shown in FIG. 13, the plating liquid collecting device 80 includes a collecting tank 88 that stores a used plating liquid 85 drained from the plating liquid draining device 120; and a collecting tank deaerating unit 84 connected to the collecting tank 88 and configured to remove dissolved oxygen and dissolved hydrogen in the plating liquid 85 stored in the collecting tank 88. Like the supply tank deaerating unit 34 as described above, the collecting tank deaerating unit 84 has a gas supplying line 84a through which an inert gas such as nitrogen gas is supplied into the collecting tank 88. That is, the collecting tank deaerating unit 84 is configured to remove the dissolved oxygen and the dissolved hydrogen in the plating liquid 85 by so-called bubbling. The configuration and effect of the collecting tank deaerating unit 84 and the gas supplying line 84a are the same as those of the supply tank deaerating unit 34 and the gas supplying line 34a. Thus, detailed description thereof will be omitted here.

Further, the plating liquid collecting device 80 may further include a supplementing unit 88a configured to supplement component deficient in the used plating liquid 85 drained from the plating liquid draining device 120; and an agitating unit 81 configured to agitate the plating liquid 85 stored in the collecting tank 88. The supplementing unit 88a supplements chemical liquids such as a NiP metal salt containing Ni, a reducing agent or an additive in the plating liquid 85, so that the composition of the plating liquid 85 is appropriately adjusted. In order to perform such composition adjustment more accurately, as indicated by a dashed dotted line in FIG. 13, a monitoring unit 87b configured to monitor the characteristics of the plating liquid 85 may be provided at the collecting tank 88. The monitoring unit 87b may be formed by, but not limited to, a pH monitor configured to monitor a pH value of the plating liquid 85.

For example, the agitating unit 81 may be configured to agitate the plating liquid 85 by circulating the plating liquid 85 in a vicinity of the collecting tank 88, as illustrated in FIG. 13. The agitating unit 81 may include, as shown in FIG. 13, a collecting tank circulating line 82 of which both ends 82a and 82b are connected to the collecting tank 88; and a pump 86 and a filter 89 provided at the collecting tank circulating line 82. By providing the agitating unit 81 having this configuration, it may be possible to remove various impurities contained in the plating liquid while agitating the plating liquid 85. For example, it is possible to remove impurities (particles), which may serve as nuclei when metal ions are precipitated, from the plating liquid. Further, a connection line 83 through which the plating liquid 85 is supplied to the supply tank 31 is connected to the agitating unit 81.

An operation of the second illustrative embodiment having the above-described configuration will be explained. Here, a method of collecting a used Ni plating liquid and recycling the used Ni plating liquid will be described with reference to FIG. 14. In a flowchart of FIG. 14, the same processes as those of the first illustrative embodiment shown in FIGS. 9 and 10 will be assigned same reference numerals, and detailed description thereof will be omitted.

(Collecting Process)

The plating liquid 85 after used in performing a Ni plating process on a substrate 2 is dispersed from the substrate 2 and reaches a discharge opening 124. The used plating liquid 85 reaching the discharge opening 124 is then supplied into the collecting tank 88 through the collecting flow path 122 of the liquid draining device 120.

(Composition Adjusting Process)

Thereafter, by using the aforementioned supplementing unit, a component deficient in the used plating liquid 85 is supplemented (S322). At this time, the plating liquid 85 is agitated by using the agitating unit 81 to allow the supplemented component to be mixed with the used plating liquid 85 sufficiently.

(Deaerating Process)

After or concurrently with the composition adjusting process S322, dissolved oxygen and dissolved hydrogen in the plating liquid 85 stored in the collecting tank 88 are removed (S323). To elaborate, as shown in FIG. 13, nitrogen is introduced into the collecting tank 88 through the gas supplying line 84a. The dissolved oxygen and the dissolved hydrogen in the plating liquid 85 stored in the collecting tank 88 are displaced with dissolved nitrogen, so that the dissolved oxygen and the dissolved hydrogen in the plating liquid 85 are removed.

The plating liquid 85 from which the dissolved oxygen and the dissolved hydrogen are removed is supplied into the supply tank 31 through the connection line 83, as depicted in FIG. 13.

Processes S313 to S317 of the Ni plating method using the collected and recycled plating liquid are substantially the same as processes S313 to S317 of the first illustrative embodiment shown in FIG. 10. Thus, detailed description thereof will be omitted.

(Effect of Second Illustrative Embodiment)

In accordance with the second illustrative embodiment, the used plating liquid 85 is reused by the plating liquid collecting device 80. Thus, the plating liquid can be utilized more effectively, and cost for the plating liquid can be reduced. The plating liquid collecting device 80 includes the collecting tank deaerating unit 84 configured to remove the dissolved oxygen and the dissolved hydrogen in the plating liquid 85. With this configuration, the concentration of the dissolved oxygen in the plating liquid 85 can be decreased, so that the lifetime of the plating liquid 85 can be increased. Further, the concentration of the dissolved hydrogen in the plating liquid 85 can also be decreased, so that reduction of metal ions in the plating liquid due to a reduction reaction of the hydrogen can be prevented. Therefore, it is possible to prevent reduced metal ions from being precipitated in the vicinity of the copper wiring.

In addition, in accordance with the second illustrative embodiment, as shown in FIG. 13, the supply tank 31 also includes the supply tank deaerating unit 34. With this configuration, the concentrations of dissolved oxygen and dissolved hydrogen in the plating liquid 35 can be further decreased. Accordingly, the lifetime of the plating liquid 35 can be further increased, and reduction of metal ions in the plating liquid due to a reduction reaction of hydrogen can be further strongly prevented. Therefore, the effect of increasing the lifetime of the plating liquid 35 can be further enhanced by heating the plating liquid 35 through two stage by using the first heating device 50 and the second heating device 60 (see FIG. 13).

Furthermore, as in the first illustrative embodiment, the physical cleaning device 70 may be provided in the second illustrative embodiment to remove a spherical metal (defect) that might be precipitated in the vicinity of the copper wiring. With this configuration, even in case that dissolved hydrogen in the plating liquid cannot be removed completely and a defect is generated in the vicinity of the copper wiring, such a defect can be removed.

Besides, the second illustrative embodiment has been described for the example case where the dissolved oxygen and the dissolved hydrogen in the plating liquid 85 stored in the collecting tank 88 are removed by the collecting tank deaerating unit 84 and the dissolved oxygen and the dissolved hydrogen in the plating liquid 35 stored in the supply tank 31 are removed by the supply tank deaerating unit 34. However, the illustrative embodiment may not be limited thereto. For example, when the dissolved oxygen and the dissolved hydrogen in the plating liquid can be sufficiently removed by the collecting tank deaerating unit 84, the supply tank deaerating unit 34 may be unnecessary.

Further, the modification examples described in the first illustrative embodiment may be adopted in the second illustrative embodiment. By way of example, the supply tank circulating line 52 of the supply tank circulating/heating unit 51 may be connected to the plating liquid supplying line 33 in the vicinity of the second heating device 60. Further, as indicated by a dashed dotted line in FIG. 13, a supply line heating unit 54 configured to maintain the plating liquid 35 passing through the plating liquid supplying line 33 at the first temperature may be further provided. When a heating pipeline configured to allow a heat transfer medium heated to the first temperature to flow therethrough is used as the supply line heating unit 54, the first temperature medium supplying unit 63 of the second heating device 60 may be used as a medium supplying unit configured to supply the heat transfer medium of the first temperature to the supply line heating unit 54.

EXPLANATION OF CODES

1: Plating system
2: Substrate
20: Plating apparatus
30: Plating liquid supplying device
31: Supply tank
32: Discharge nozzle
33: Plating liquid supplying line
34: Supply tank deaerating unit
34a: Gas supplying line
35: Plating liquid
50: First heating device
51: Supply tank circulating/heating unit
52: Supply tank circulating line
53: Supply tank heater
54: Supply line heating unit
60: Second heating device
61: Second temperature medium supplying unit
62: Temperature controller
63: First temperature medium supplying unit
65: Temperature maintaining unit
70: Physical cleaning device
71: Droplet discharging unit
72: two-fluid nozzle
74: Cleaning liquid
74a: Supplying line
75: Droplet generating gas
75a: Supplying line
79a: Brush unit
80: Plating liquid collecting device
81: Agitating unit
82: Collecting tank circulating line
84: Collecting tank deaerating unit
85: Used plating liquid
88: Collecting tank
88a: Supplementing unit
90: Cleaning liquid supplying device
95: Rinse liquid supplying device
110: Substrate holding/rotating device
161: Storage medium

What is claimed is:

1. A plating apparatus of performing a plating process by supplying a plating liquid onto a substrate, the plating apparatus comprising:
   a substrate accommodating unit configured to accommodate therein the substrate;
   a plating liquid supplying device configured to supply the plating liquid of a preset temperature to the substrate accommodated in the substrate accommodating unit;
   a plating liquid draining device configured to drain the plating liquid dispersed from the substrate out of the substrate accommodating unit; and
   a controller configured to control the plating liquid supplying device and the plating liquid draining device,
   wherein the plating liquid supplying device includes a supply tank configured to store therein the plating liquid to be supplied onto the substrate; a discharge nozzle configured to discharge the plating liquid onto the substrate; and a plating liquid supplying line through which the plating liquid of the supply tank is supplied into the discharge nozzle,
   a first heating device is provided at either one of the supply tank and the plating liquid supplying line of the plating liquid supplying device, and is configured to heat the plating liquid to a first temperature lower than the preset temperature, and a second heating device is provided at the plating liquid supplying line between the first heating device and the discharge nozzle, and is configured to heat the plating liquid to a second temperature equal to or higher than the preset temperature, wherein the second heating device includes:

a second temperature medium supplying unit configured to heat a second heat transfer medium to the second temperature;

a temperature controller provided at the plating liquid supplying line between the first heating device and the discharge nozzle, and configured to heat the plating liquid to the second temperature by using heat of the second heat transfer medium from the second temperature medium supplying unit; and a first temperature medium supplying unit configured to heat a first heat transfer medium to the first temperature, and the controller is configured to supply the first heat transfer medium from the first temperature medium supplying unit to the temperature controller after stopping the discharge of the plating liquid from the discharge nozzle such that the plating liquid remaining in the temperature controller is cooled to the first temperature, wherein a heat transfer medium supplying line is connected with the temperature controller to supply the first and second heat transfer mediums to the temperature controller, and a flow path switching device is provided at the heat transfer medium supplying line to allow either one of the first heat transfer medium of the first temperature from the first temperature medium supplying unit and the second heat transfer medium of the second temperature from the second temperature medium supplying unit to flow in the heat transfer medium supplying line selectively.

2. The plating apparatus of claim 1, wherein the first heating device includes a supply tank circulating/heating unit configured to heat the plating liquid within the supply tank to the first temperature, and the supply tank circulating/heating unit includes a supply tank circulating line through which the plating liquid within the supply tank is circulated; and a supply tank heater provided at the supply tank circulating line and configured to heat the plating liquid to the first temperature.

3. The plating apparatus of claim 2, wherein the supply tank circulating line of the supply tank circulating/heating unit is connected to the plating liquid supplying line in a vicinity of the second heating device.

4. The plating apparatus of claim 1, wherein the first heating device includes a supply line heating unit that is provided at the plating liquid supplying line to be extended up to a vicinity of the second heating device along the plating liquid supplying line, and that is configured to heat the plating liquid to the first temperature.

5. The plating apparatus of claim 1, wherein the first heating device includes a supply line heating unit provided at the plating liquid supplying line to be extended up to a vicinity of the second heating device along the plating liquid supplying line, the supply line heating unit is formed by a heating pipeline provided to surround the plating liquid supplying line, and the second heating device is configured to supply the first heat transfer medium from the first temperature medium supplying unit into the heating pipeline of the supply line heating unit of the first heating device after stopping the discharge of the plating liquid from the discharge nozzle.

6. The plating apparatus of claim 1, further comprising:

a physical cleaning device configured to clean the substrate by applying a physical force to the substrate, wherein the physical cleaning device is configured to clean the substrate by applying the physical force to the substrate after the plating liquid is supplied onto the substrate and before the substrate is dried.

\* \* \* \* \*